US011605475B1

(12) United States Patent
Germann

(10) Patent No.: US 11,605,475 B1
(45) Date of Patent: *Mar. 14, 2023

(54) SCALABLE, ELECTRO-OPTICALLY INDUCED FORCE SYSTEM AND METHOD

(71) Applicant: Geoffrey James Germann, Spring, TX (US)

(72) Inventor: Geoffrey James Germann, Spring, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/539,855

(22) Filed: Dec. 1, 2021

Related U.S. Application Data

(63) Continuation of application No. 17/001,628, filed on Aug. 24, 2020, now Pat. No. 11,239,002, which is a continuation-in-part of application No. 16/420,162, filed on May 23, 2019, now Pat. No. 10,790,071, which is a continuation-in-part of application No. 15/959,280, filed on Apr. 23, 2018, now Pat. No. 10,354,772, which is a continuation-in-part of application No. 15/406,737, filed on Jan. 15, 2017, now Pat. No. 9,984,782.

(51) Int. Cl.
| | |
|---|---|
| *G21K 1/00* | (2006.01) |
| *G01Q 80/00* | (2010.01) |
| *H01S 3/108* | (2006.01) |
| *G21K 5/02* | (2006.01) |
| *G02F 1/00* | (2006.01) |
| *H03L 7/00* | (2006.01) |
| *H05H 3/04* | (2006.01) |

(52) U.S. Cl.
CPC ............ *G21K 1/003* (2013.01); *G01Q 80/00* (2013.01); *G02F 1/0018* (2013.01); *G21K 5/02* (2013.01); *H01S 3/108* (2013.01); *H03L 7/00* (2013.01); *H05H 3/04* (2013.01)

(58) Field of Classification Search
CPC .......... G21K 1/003; G21K 5/02; G01Q 80/00; G02F 1/0018; H01S 3/108; H03L 7/00; H05H 3/04
See application file for complete search history.

(56) References Cited

U.S. PATENT DOCUMENTS

| | | | |
|---|---|---|---|
| 11,239,002 B1 * | 2/2022 | Germann | ............... G02F 1/0018 |
| 2006/0163463 A1 | 7/2006 | Grier | ............................. 250/251 |

* cited by examiner

*Primary Examiner* — Nicole M Ippolito
*Assistant Examiner* — Hanway Chang
(74) *Attorney, Agent, or Firm* — Adibi IP Group, PC; Amir V. Adibi; Andrew C. Palmer

(57) ABSTRACT

A technique is disclosed for electro-optically inducing a force to fabricated samples and/or devices with laser light. The technique uses the interaction of the oscillating electric field of the laser beam in opposition with the electric field produced by an appropriate electric charge carrier to achieve a net repulsive (or attractive) force on the component holding the electric charge. In one embodiment, force is achieved when the field near the charge carrier is modulated at a subharmonic of the electric field oscillation frequency of the laser and the relative phases of the light field and electric charge carrier field are controlled to provide optimal repulsion/attraction. The effect is scalable by applying the technique to an array of charge carrier fields sequentially as well as using higher power lasers and higher carrier field voltages.

8 Claims, 26 Drawing Sheets

Gray-scale image of the electric field of a propagating laser:
location (x) vs time (t)
Case 1: without phase modulation and without dispersion Gray-scale image of the electric field of a propagating laser:
location (x) vs time (t)
Case 2: without phase modulation and with dispersion

SCALABLE, ELECTRO-OPTICALLY INDUCED FORCE SYSTEM AND METHOD

CROSS REFERENCE TO RELATED APPLICATIONS

This application is a continuation of, and claims the benefit under 35 U.S.C. § 120 from, nonprovisional U.S. patent application Ser. No. 17/001,628, entitled "Scalable, Electro-Optically Induced Force System And Method," filed on Aug. 24, 2020. Application Ser. No. 17/001,628, in turn, is continuation-in-part of, and claims the benefit under 35 U.S.C. § 120 from, nonprovisional U.S. patent application Ser. No. 16/420,162, entitled "Scalable, Electro-Optically Induced Force System And Method," filed May 23, 2019. Application Ser. No. 16/420,162, in turn, is a continuation-in-part of, and claims the benefit under 35 U.S.C. § 120 from, nonprovisional U.S. patent application Ser. No. 15/959,280, entitled "Scalable, Electro-Optically Induced Force System And Method," filed Apr. 23, 2018. Application Ser. No. 15/959,280, in turn, is a continuation-in-part of, and claims the benefit under 35 U.S.C. § 120 from, nonprovisional U.S. patent application Ser. No. 15/406,737, entitled "Scalable, Electro-Optically Induced Force System And Method," filed Jan. 15, 2017. The subject matter of each of the foregoing documents is expressly incorporated herein by reference.

TECHNICAL FIELD

The present invention relates generally to techniques for applying a force or inducing a change in momentum to objects using interacting electromagnetic fields and, particularly, to techniques for applying a force or inducing a change in momentum to objects using a laser beam as one of the sources of the electromagnetic fields.

BACKGROUND INFORMATION

The manipulation of samples or devices through the use of electromagnetic (EM) radiation has a number of advantages over mechanical or "tactile" manipulation.

Typically, EM manipulation is less mechanically destructive and can be accomplished through mechanical barriers where other more traditional means are not effective. EM manipulation has become more prevalent as technology has advanced and is now accomplished through both constant field applications (as in the case of superconductor facilitated magnetically induced levitation) and oscillating field applications (e.g. laser assisted cooling and trapping).

The manipulation of mass through the use of laser light has found many applications as laser technology has evolved. Not simply laser photolysis or spectroscopy, but coherent control of chemical reactions is becoming possible (see P. Brumer and M. Shapiro, Sci. Am., pg. 56, March 1995). Laser atom or molecule trapping has seen a great deal of activity (see S. Chu, Science, pg. 861, 23 Aug. 1991; C. N. CohenTannoudji and W. D. Phillips, Phys. Today, pg. 33, October 1990) and has led to the observation of Bose-Einstein condensation and the improvement of atomic clocks. Control of larger mass samples with laser energy has also been demonstrated. "Optical tweezers" have been used to stretch single strands of DNA and manipulate chromosomes inside cell nuclei and move entire cellular organelles without destroying the cell wall (see S. Chu, Sci. Am., pg. 71, February 1992). Standing wave laser radiation has also been used to deflect atomic beams in flight (see P. E. Moskowitz, P. L. Gould, and D. E. Pritchard, J. Opt. Soc. Am. B., 2,11, 1784, 1985).

All of these techniques allow for control of small samples with laser light, but none of these is practically applicable to larger samples or efficiently uses the laser light to accomplish the manipulation. One of the difficulties is that many of the current techniques operate by inducing an electric charge polarization in the sample. The force which can be induced by the laser beam is directly related to the degree to which a sample can be polarized before it is damaged. The laser peak intensity must be controlled or the sample can be overheated, ionized or destroyed. This limits the achievable manipulation force. Also, these techniques commonly require the laser to be focused on the target sample, limiting the length of interaction and thus the efficiency with which the laser energy is coupled into translation. Other techniques rely on the transfer of photon momentum in the optical scattering process, but this is extremely inefficient as photons at commonly accessible wavelengths have very little mass.

Therefore, it is the object of the present invention to provide a system that 1) employs laser light to apply a force to objects that 2) is scalable, that 3) maximizes the efficiency with which the laser light is utilized for said force, that 4) the intensity of laser light employed by the system should not be limited by the risk of damage to the object upon which the force is induced.

SUMMARY

The essence of electro-optically induced force and/or momentum is to mimic the repulsion manifested when two like charged wires come into proximity with one another. Wires carrying like charges repel one another due to the mutual opposition of the electric fields generated by the charges on the wires. An electro-optically induced force is realized when one of the wires is replaced with a substitute that maintains an electric field in opposition to the field generated by the first wire (e.g. a photon or radiation field). The principles employed by the present invention to electro-optically induce a force to manipulate objects are now described.

FIG. 1 shows a schematic of 1) the electric field around an electrically charged wire parallel to the Z-axis (i.e. perpendicular to the page of the schematic) (100), 2) the projection of said electric field on the Y-axis (vertical in the plane of the page), said projection is described by a sine function (102), 3) the electric field of a laser beam propagating in space perpendicular to the wire, 1) above (104), 4) the electric field of a laser beam retro reflected by a mirror with a surface perpendicular to the laser beam path (106).

FIG. 2 shows a schematic of the field interaction, in space at a given instant, between the electric field from a charged wire (200) and the electric field of a laser beam travelling proximate and perpendicular to the charged wire (202) (i.e. for those fields illustrated in FIG. 1). It should be noted that, in the case of a freely propagating laser, a continuous sine wave, and the Y-axis component of the electric field shown, a second sine wave, the net field interaction will always be zero, a function of the orthogonality of sine functions. But, in the case of a retro reflected laser beam, by positioning the retro reflecting mirror judiciously, the spatial relationship between the standing electric field of the wire (200) and the electric field of the laser (202) and can be chosen so the net field interaction between the electric field of the laser and the electric field near the wire, at the given moment illustrated, is non-zero. The net field interaction (204) is shown schematically in FIG. 2.

It should be noted that the spatial relationship between the electric field of the laser and the standing electric field near the wire can be altered, and a non-zero net field interaction achieved, using transmissive optics as well. A schematic is shown in FIG. 3. In this case, the change in refractive index, n, between the original propagation medium (e.g. air, for which n~1) and the medium of the optic (e.g. glass, for which n~1.5) gives rise to a phase change between the electric field near the wire along the propagation direction of the laser (300) and the electric field of the laser (302). This changes the integral of the interaction between the two electric fields (304) to a, potentially, non-zero value.

A final case is shown schematically in FIG. 4. The spatial relationship between the electric field near the wire (400) and the electric field of the laser (402) is altered by directing the laser through an aperture of an electrically conductive material. In such a case the conductive material screens the electric field near the wire (400) from interaction with the electric field of the laser (402) internal to the conductive material. This changes the integral of the interaction between the two electric fields (404) to a, potentially, non-zero value.

The above describes methods for achieving a non-zero net field interaction at a given moment in time, meaning a given phase of the laser light, but the electric field of a laser oscillates at frequency given by f=c/λ, where c is the speed of light and λ is the wavelength of the laser. This frequency is typically hundreds of terahertz, much faster than practical electronic signals can be generated, and so any momentary interaction between the laser and the standing electric field of the wire will quickly integrate to zero. In order to sustain and extend a net field interaction over time, it is necessary to vary the electric field near the wire.

FIG. 5 shows a schematic of the interactions, in time, between the electric field near a wire driven by a square waveform (500) and the electric field of a laser beam traveling proximate and perpendicular to the wire (502). The accumulated field interaction (504) over one period of the waveform driving the charge on the wire is given by $$F = \int sin(\omega_l(t)) * f_{sg}(t, \theta_{pm}) \partial t \qquad \text{Eq. 1}$$

and is shown schematically in FIG. 5. Where, ωl is the frequency of the laser beam, fsg is the time-variant electric field near the wire, and θpm is the value of the time-variant optical phase modulation induced to the electric field near the wire.

It should be noted that, 1) depending on the relative phase of the given electric fields, the above integral (eq. 1) can be either positive or negative, corresponding to the case of generating a repulsive or attractive force, respectively and 2) although the waveform shown in FIG. 5 is a square wave, that need not be the case. Since the signal driving the electric field on the wire cantilever is electronically generated, fsg can be configured as any function that is determined to facilitate the desired effect. Note is given to the case of a phase modulated sine wave.

Consider a specific case: a signal generator operating at 5.64 GHz and common laser wavelength, 532 nm or ~5.64× 1014 Hz. In this case, the laser is operating at a frequency that is one hundred thousand times faster than the signal generator. In this example, the electric field of the laser and the electric field induced near the wire may only be in opposition, in time, space, and intensity, a fraction measured in parts per million (ppm) depending on the specific wave shape and/or modulation induced to the electric field near the wire. But, as described below, a field carrier array may be constructed with very high density, with feature spacing in the sub-micron range. In such a case, one could achieve one million, or more, field interaction locations per meter, and so, even if the electric field of the laser and the electric field near the charge carrier are in opposition a small fraction of the time per oscillation at each location, integrating one million locations over the length of a one meter array, comprised of one million elements, can afford substantial accumulated force between the electric field of the laser and the electric field(s) near the array.

The teachings of the present invention are operable in systems where the electric fields are neither free-space nor produced by a laser. The present invention is generally directed to any electro-optical system including a charge carrier configured to carry a charge distribution that gives rise to a first electromagnetic field, and a radiation source configured to generate a second electromagnetic field that interacts with the first electromagnetic field so as to produce a net force on the charge carrier.

Further details and embodiments and methods are described in the detailed description below. This summary does not purport to define the invention. The invention is defined by the claims.

BRIEF DESCRIPTION OF THE DRAWINGS

Additional objects and features of the invention will be more readily apparent from the following detailed description and appended claims when taken in conjunction with the drawings, in which:

DETAILED DESCRIPTION

Figure 1:
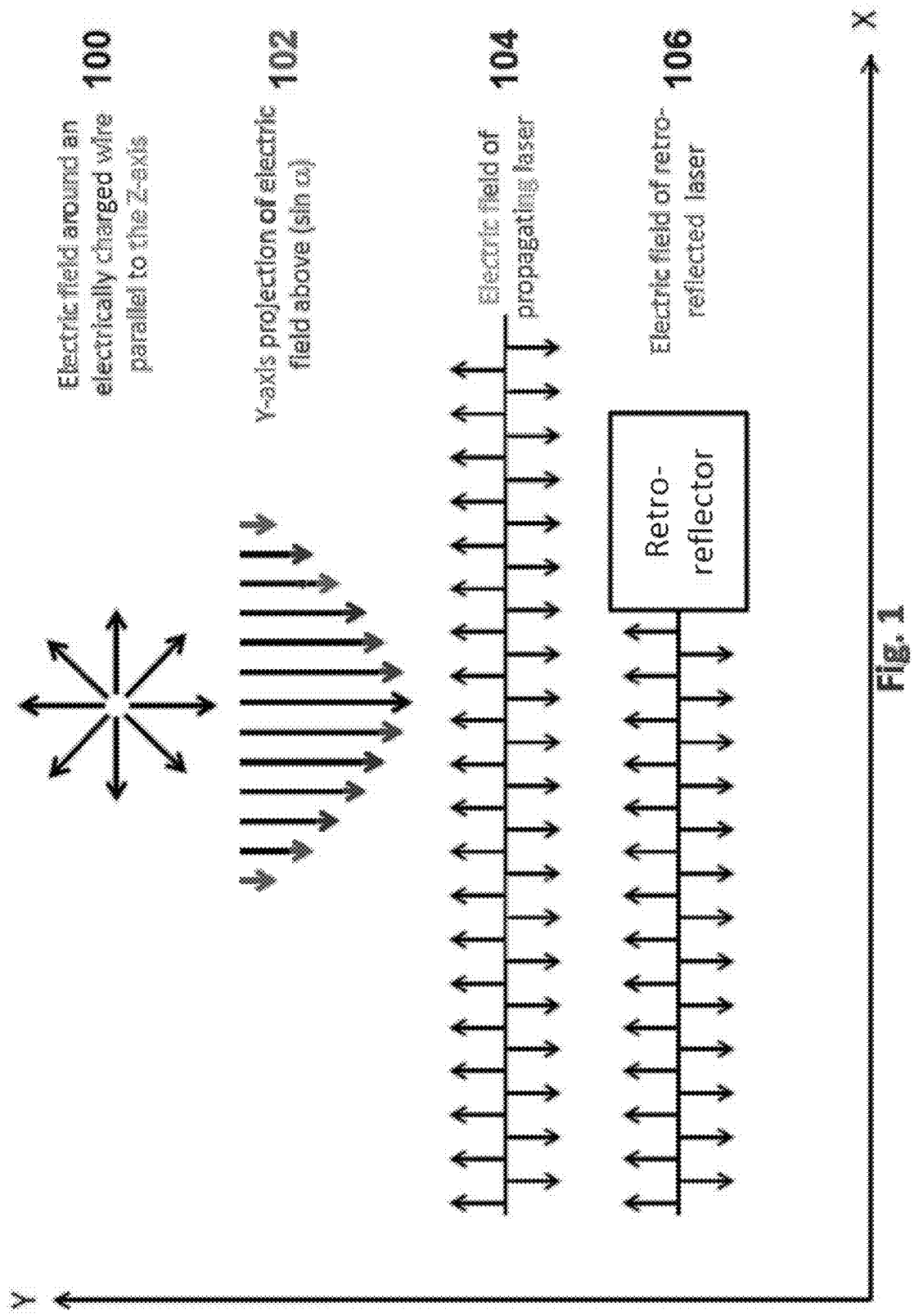
FIG. 1 is a schematic diagram illustrating the electric fields employed in the present invention.
Figure 2:
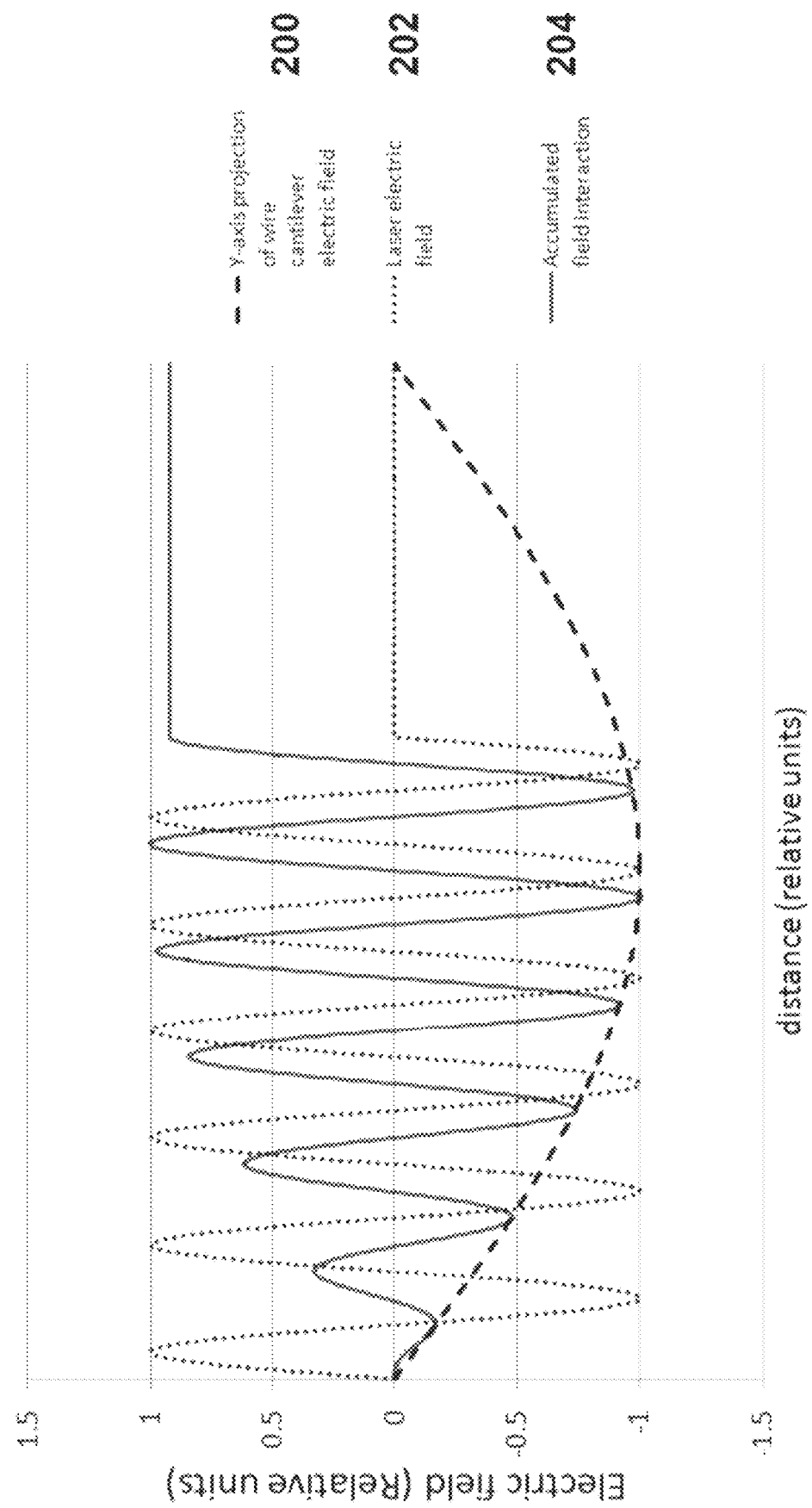
FIG. 2 is a schematic diagram illustrating phase relationship between the electric fields employed in the present invention, retro-reflecting case.

Reference will now be made in detail to some embodiments of the invention, examples of which are illustrated in the accompanying drawings.

The present invention allows for the application of laser light to achieve a scalable electromagnetically induced force to samples of greater mass than previous techniques and for more efficient use of the applied laser light. The sample upon which the force is realized must be of specific construction to support an electric charge distribution and variation to achieve a net repulsion or attraction with the laser light. Using this approach the laser need not be focused on the sample nor induce an electric charge polarization on the sample. This allows the force to be integrated over a longer distance, greatly improving the efficiency with which the laser energy is used and increasing the mass amenable to manipulation by the techniques of the present invention.

Several recent advancements have driven this invention. First, the laser power available from smaller, less expensive devices is increasing continuously. Laser devices are now being constructed that produce watts of laser energy from laser heads that are millimeters or even micrometers in size.

As for the magnitude of the accumulated force, let us consider the example of a 10 W laser. Currently such lasers can be fabricated at relatively low cost, and weigh on the order of grams. Ten Watts (10 N*m/s) of optical power, if converted entirely to work (N*m) could lift 1 kg of mass 1 meter per second against earth's gravity (9.8 m/s^2). An array of one thousand 10 W lasers, or the case of a single 10 kW laser, could potentially lift tons.

It is the object of this invention to be scalable and to enable such applications.

Second, laser energy efficiency is improving as technology advances. As an example, 35-60% of the energy spent to drive some laser diodes is converted directly to laser light energy.

Third, circuit features smaller than 0.25 micrometers can now be fabricated and this technology continues to advance to fabricate features of even smaller size. This feature size is less than half the wavelength of light produced by many high power laser packages. This provides an excellent opportunity to construct a periodic charge distribution giving rise to a periodic electric field that can directly counter the periodic electric field of a laser beam. This is an ideal arrangement for electromagnetic repulsion/attraction (i.e., electro-optically induced force).

Single Frequency Laser Source Embodiments

Signal Generator System

Figure 6:
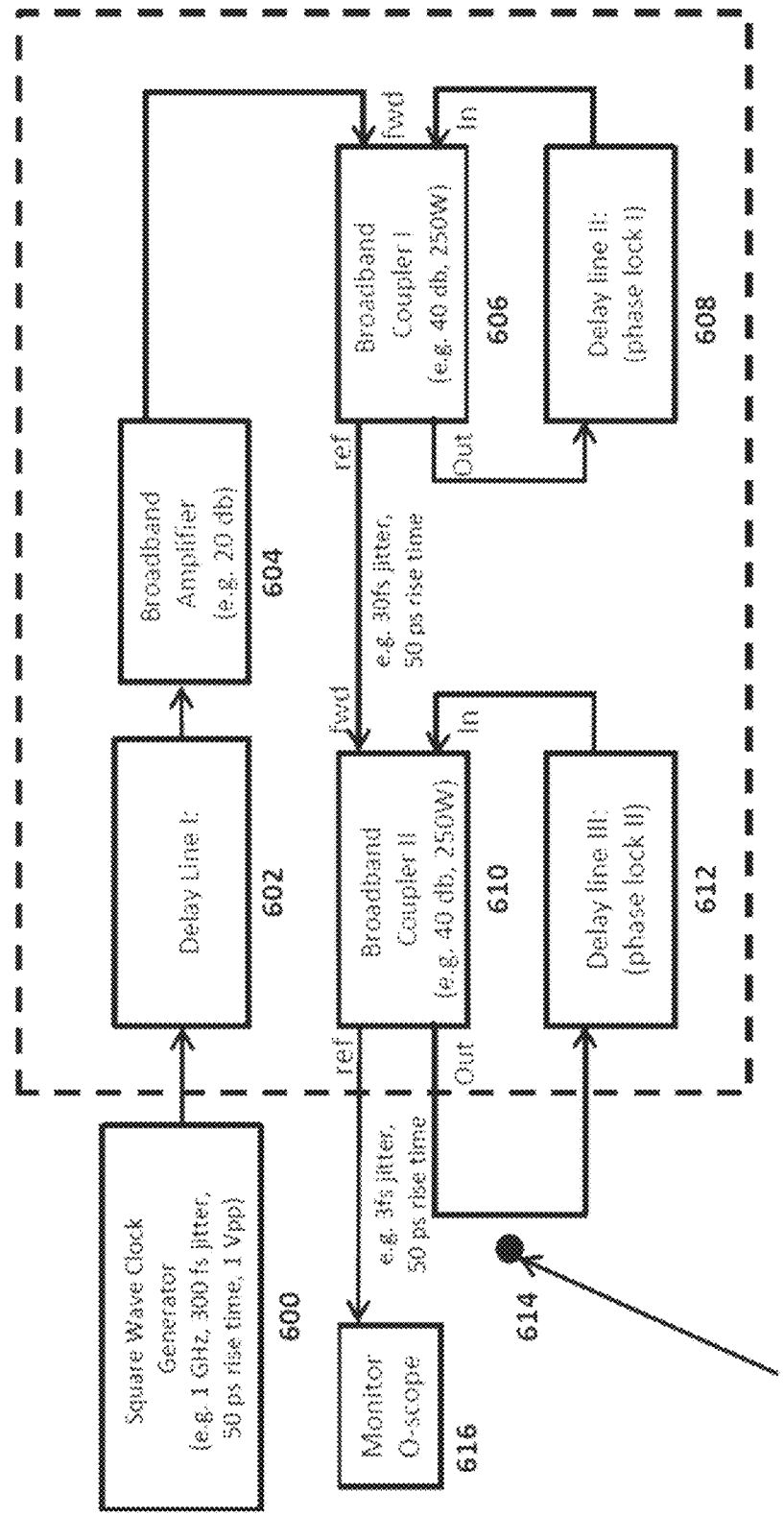
FIG. 6 is a schematic of a circuit that is configured to process a commercially available square wave into a signal sufficient to induce a measurable force between a continuous wave single frequency laser and a conductive wire cantilever.

FIG. 6 shows a schematic of a circuit used to process a commercially available square wave into a signal sufficient to induce a measurable force between a continuous wave single frequency laser and a conductive wire cantilever. A square wave signal generator (600) is set to generate a drive signal at a subharmonic of the laser frequency (e.g. one hundred thousandth of the laser frequency). The output of the signal generator is directed through an adjustable delay line (602). It is advantageous to drive the signal at higher voltage since the field interactions sought scale with the field intensity and thus voltage applied. The signal can be amplified using a broadband amplifier (604) to increase the net force induced.

Commercially available signal sources (e.g. square wave clock generators) may have signal jitter in the 100 to 300 femtosecond range, but the laser electric field oscillation for commercially available single frequency lasers (e.g. a 532 nm laser) is approximately 2 femtoseconds. In such a case, the jitter of the square wave will preclude any efficient induction of force on the wire cantilever as it will tend to average out any net repulsion/attraction. It is necessary to improve the square wave signal jitter to provide for stable and efficient field interactions. To accomplish this, the processed square wave signal, described above, is directed into the forward port of a broadband directional coupler (606). The output of the directional coupler is sent to a third adjustable delay line (608) and back to the input port of the broadband coupler (606), creating a loop. The delay line (608) is adjusted to phase lock the resultant signal loop. In effect the delay line (608) is adjusted to ensure that the signal loop is an integer multiple of the square wave length. In such an arrangement, the jitter of the input signal is reduced by the square root of the number of round trips the signal makes in the loop. In the case of a 40 db power coupler, the jitter is improved by a factor of 10.

To improve the signal jitter further, the signal from the reference port of the broadband coupler (606) is directed to the forward port of a second broadband coupler (610). The output of the second broadband coupler (610) is directed through a fourth delay line (612) and back to the input port of the second broadband directional coupler (610). The delay line (612) is adjusted to phase lock the second resultant signal loop. In effect the delay line (612) is adjusted to ensure that the second signal loop is also an integer multiple of the square wave length. Again, the jitter of the input signal is reduced by the square root of the number of round trips the signal makes in the second loop. In the case of a 40 db power coupler, the jitter is improved by a further factor of 10.

In the above description, two successive directional coupler stages should be sufficient to reduce the (e.g. 200 fs) jitter of the square wave clock generator source to a value comparable to the oscillation frequency of the single frequency laser source (approximately 2 fs), but successive stages of broadband couplers and paired delay lines can be employed to reduce the jitter to desired levels.

In this embodiment, the wire cantilever configured to achieve a repulsion with the single frequency laser, below, is within the second coupler (610)/delay line (612) loop described above. The interaction site (614) is shown schematically in FIG. 6. The signal from the reference port of the second directional coupler (610) is directed to a monitor oscilloscope (616).

Figure 7:
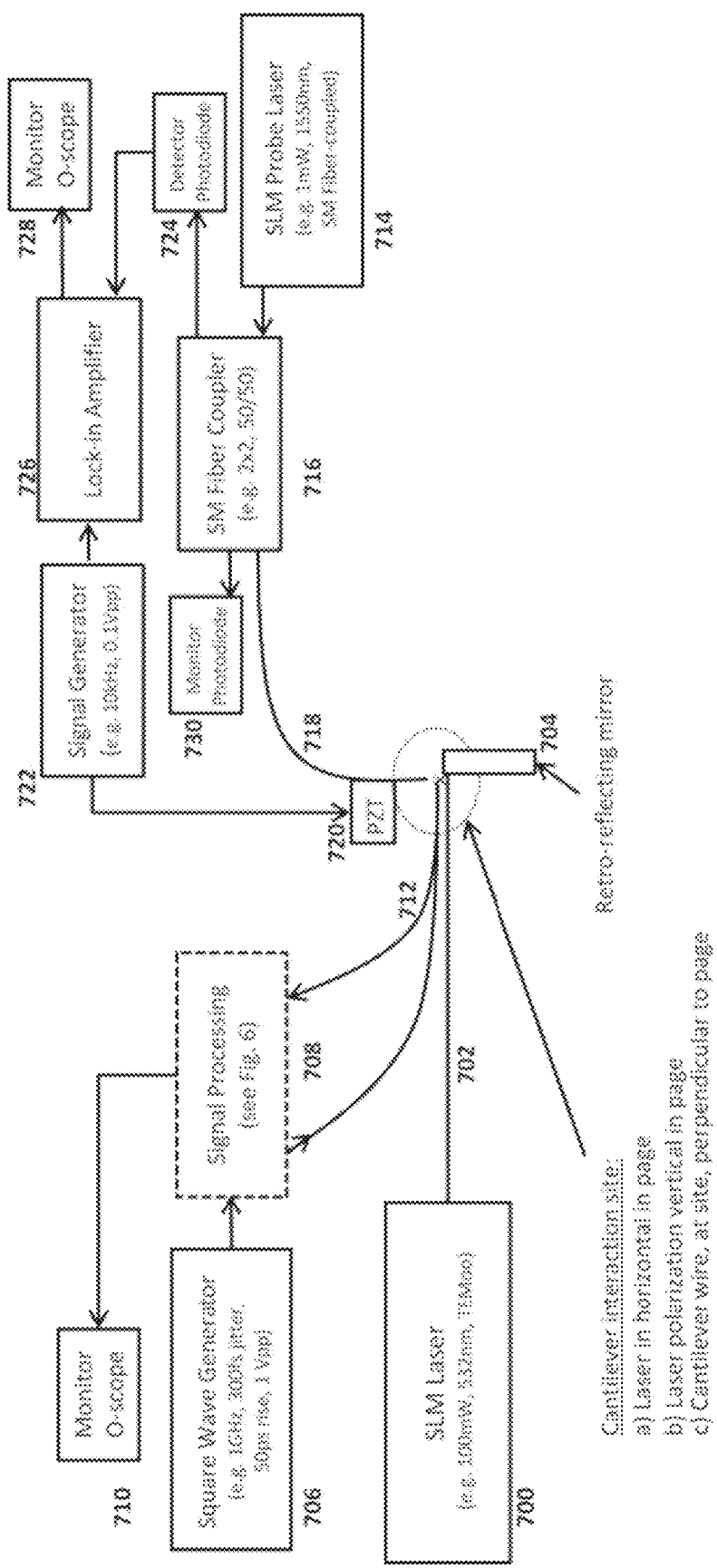
FIG. 7 is a schematic diagram illustrating a first preferred embodiment of the present invention employing a continuous wave single frequency laser and a single field carrier.

FIG. 7, shows a schematic of a preferred embodiment. A continuous wave (CW) single frequency laser (700) produces a beam (702) that is directed to a retro-reflecting mirror (704) to provide the optical electromagnetic field which will induce a force at the wire cantilever site (614) described above and shown schematically in FIG. 6. The square wave clock generator (706), signal processing circuit (708), and monitor oscilloscope (710) are the same as those described in FIGS. 6, (600), (602-612), and (616), respectively. The wire cantilever (712) consists of a length from the second directional coupler (610)/delay line (612), above, configured to be in close proximity (e.g. less than 1 mm) to the laser beam (702) and retro-reflecting mirror (704). The system is configured such that the linear polarization of the laser beam (702) is perpendicular to the wire cantilever (712).

Interferometric Force Detection System

A fiber optic force detection system similar to that used in atomic force microscope studies (D. Rugar, H.J. Mamin, and P. Guethner, Appl. Phys. Lett. 55, 25, (1989) 2588) is employed here to measure force induced between a wire cantilever loop (712) and a laser beam (702).

The output of a single-mode fiber-coupled probe laser (714) is directed into a single mode 2×2 fiber coupler (716). One optically cleaved end of the output fiber (718) of the fiber coupler (716) is positioned in close proximity (e.g. single microns) and perpendicular to the wire cantilever (712). A piezoelectric actuator, PZT (720) is attached to the optical fiber (718) and driven by a signal generator (722). The PZT (720) drives the motion of the optical fiber (718) perpendicular to the wire cantilever (712).

The single frequency laser light exiting the output of the fiber coupler (718) is made incident upon the wire cantilever (712). A portion of the light exiting the optical fiber (718) and incident on the wire cantilever (712) is reflected back into the optical fiber (718) and co-propagates with the light reflected from the internal surface of the optically cleaved fiber (718).

The return signal, the optical interferometric signal between the counter propagating reflection of the optically cleaved end of the optical fiber (718) and the reflective surface of the wire cantilever (712), travels back through the optical fiber (718), back through the fiber coupler (716), and is directed into a detector photodiode (724). The output of the detector photodiode (724) is measured using a lock-in amplifier (726), using the reference signal from the signal generator (722) driving the PZT (720). The signal from the lock-in amplifier is observed on a monitor oscilloscope (728). A monitor photodiode (730) can be employed to measure the second output of the fiber coupler (716) to ensure system stability.

The constructive and destructive interference between the light reflected from the internal surface of the optically cleaved fiber (718) and the light reflected from the wire cantilever (712), driven and detected at the frequency of the lock-in amplifier (726), allows for a very sensitive detection of movement of the wire cantilever (712) (e.g. nanometers). When the wire cantilever (712) is chosen with a small force constant, this allows for very sensitive force detection (e.g. nanoNewtons).

Laser/Carrier Field Interaction

Figure 5:
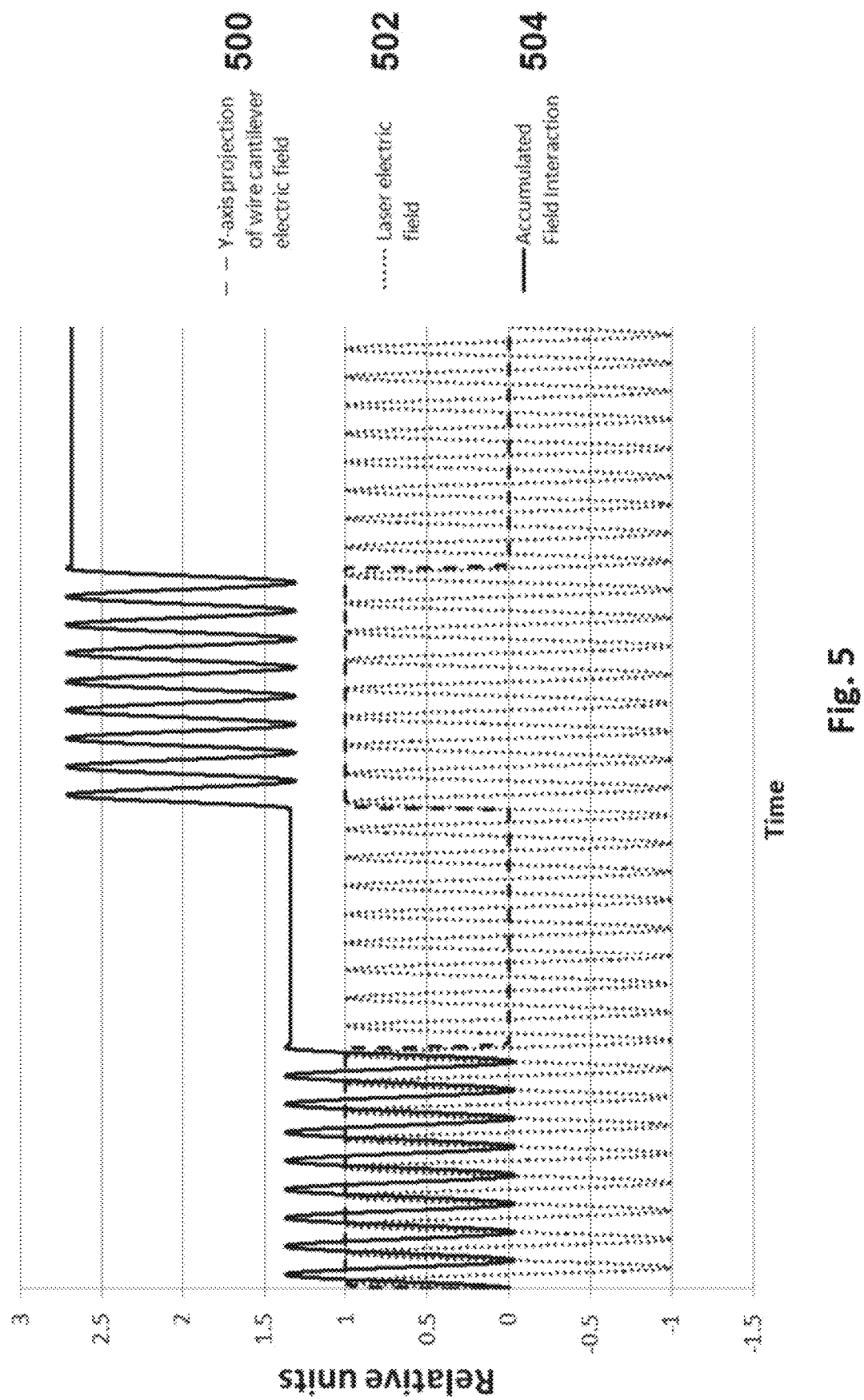
FIG. 5 is a schematic diagram illustrating the variations, in time, between the electric field of the laser and the electric field near the charge carrier, as well as the accumulated field product integral, representing the accumulated force on the carrier.

The choice of frequency of the square wave generator (706) is critical for manifestation of the desired effect. FIG. 5 shows a condition where the laser frequency (502) is an odd multiple of the cantilever driver frequency (500). In such a case, the positive, rising, half cycle of the square wave is integral over an extra (e.g. positive) half cycle of the laser oscillation and the negative, falling, half cycle of the square wave is integral over a complimentary (e.g. negative) half cycle of the laser oscillation. This frequency, and phase, relationship gives rise to cumulative, non-zero, field interaction (504) between the electric field of the laser (502) and the electric field near the wire cantilever (500) over time.

It has been noted, above, that depending on the relative phase of the given electric fields, the above integral (eq. 1) can be either positive or negative, corresponding to the case of generating a repulsive or attractive force, respectively, on the wire cantilever. In the present case, the relative phase between the oscillating electric field of the laser (700) and the oscillating electric field of the wire cantilever (712) can be easily achieved by adjusting the delay line of the signal processing circuit (602).

Carrier Array

Figure 3:
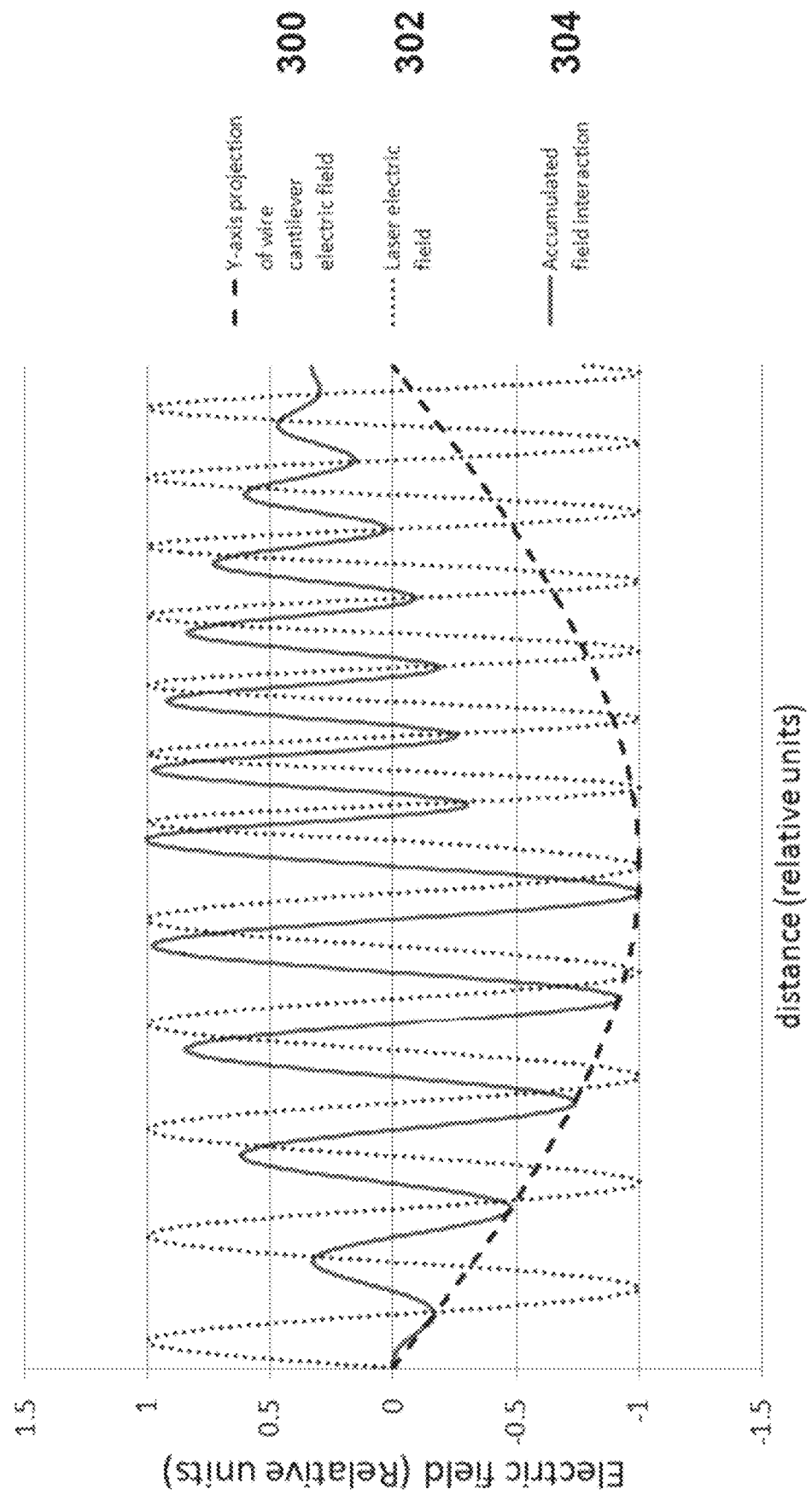
FIG. 3 is a schematic diagram illustrating phase relationship between the electric fields employed in the present invention, transmissive optic case.
Figure 4:
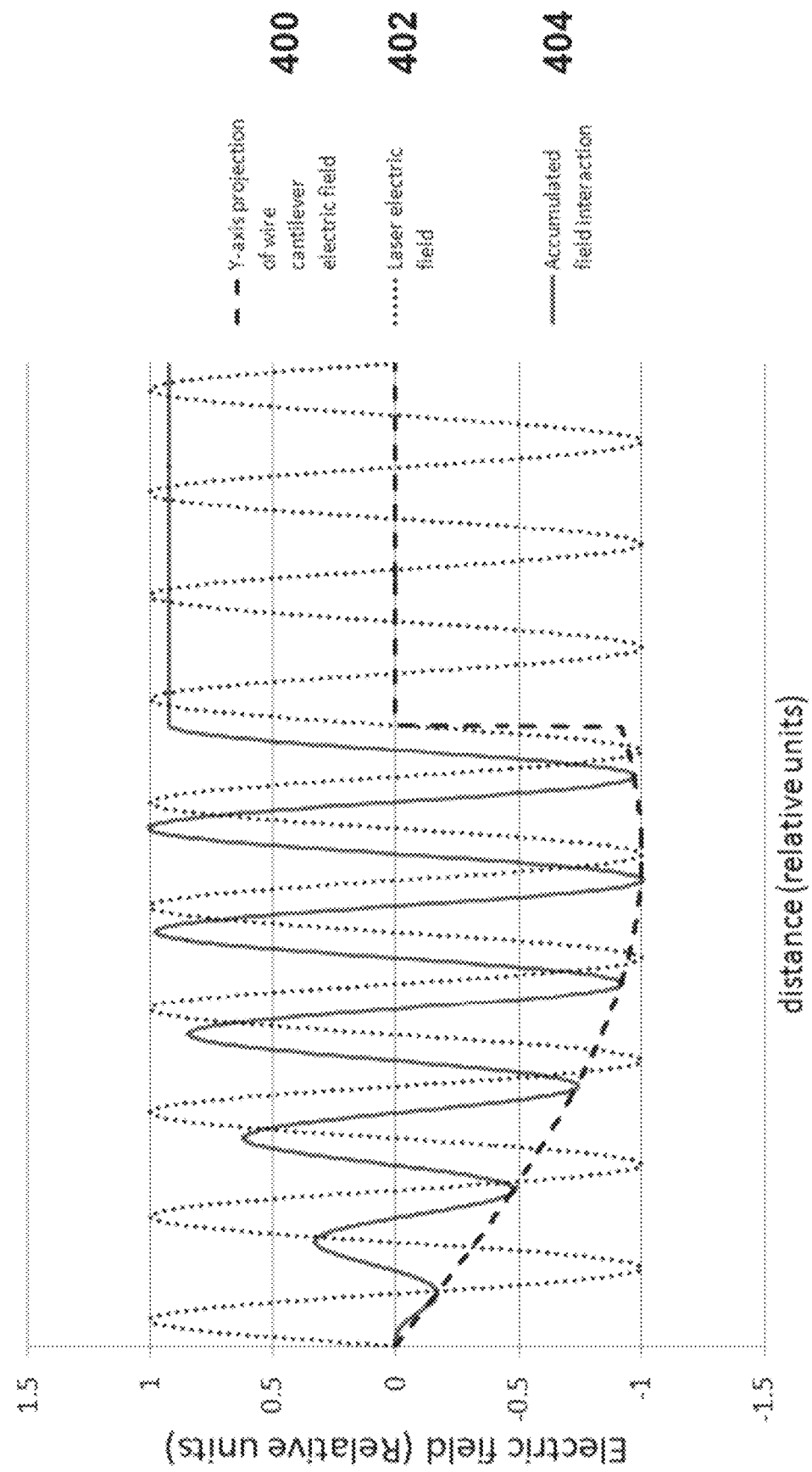
FIG. 4 is a schematic diagram illustrating phase relationship between the electric fields employed in the present invention, conductive screening case.
Figure 8:
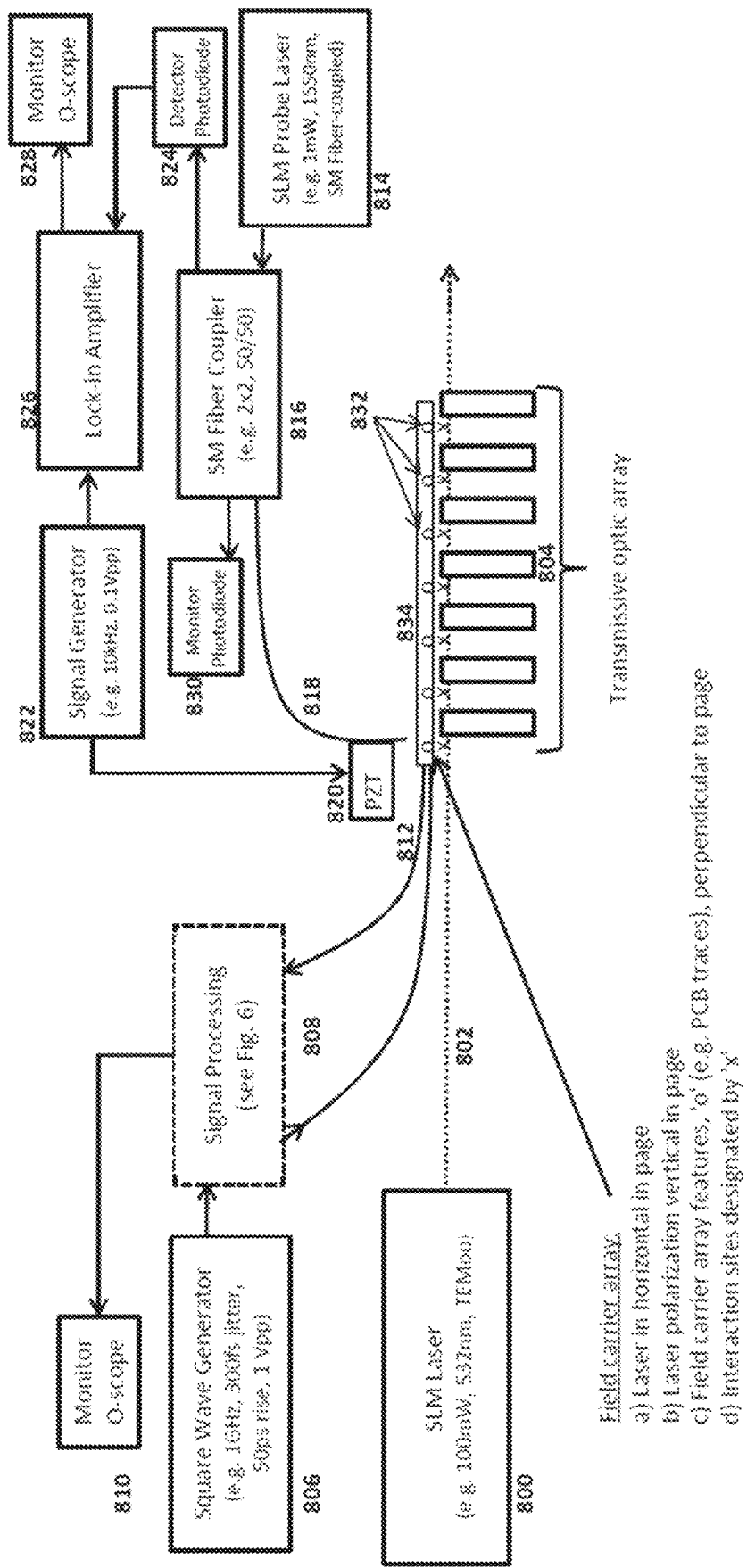
FIG. 8 is a schematic diagram illustrating a preferred embodiment of the present invention employing a continuous wave single frequency laser and a field carrier array.

FIG. 8 shows a schematic where a set of field carriers (e.g. a set of wire cantilevers, or alternatively a series of traces on a printed circuit board) (832) is arrayed perpendicular to and along a laser's (800) propagation path (802) and an equivalent set of transmissive optics (804) is paired with each field carrier to facilitate the process, as shown schematically in FIG. 3. The field carriers shown (834) share a common platform, so a single interferometric detection measurement (814-830), as shown in FIG. 7, is sufficient to measure the cumulative force on the ensemble of field carriers.

As the circuit path for each carrier is unique, each field carrier signal wave must have separate phase control to facilitate the desired effect. The phases are adjusted to maximize the force detected via the interferometric detector signal described above.

While the preferred embodiments, above, employ a single frequency laser, the techniques of the present invention are applicable to multi-mode lasers.

Multi-Mode Laser Embodiment

Typically, lasers that provide high output power operate in several longitudinal modes of the laser resonator cavity. The wavelengths of the cavity modes of any laser are given by the expression: n l=2 L, where, n is an integer, l is the wavelength of the laser light, and L is the length of the laser resonator cavity. As a result, when a multi-mode laser is used several different wavelengths of laser light are produced simultaneously.

Therefore, the present invention also includes an embodiment that uses the laser light from multimode lasers by providing a path to match each of the laser's active laser cavity modes.

Free Space Laser Propagation Embodiment

Figure 9:
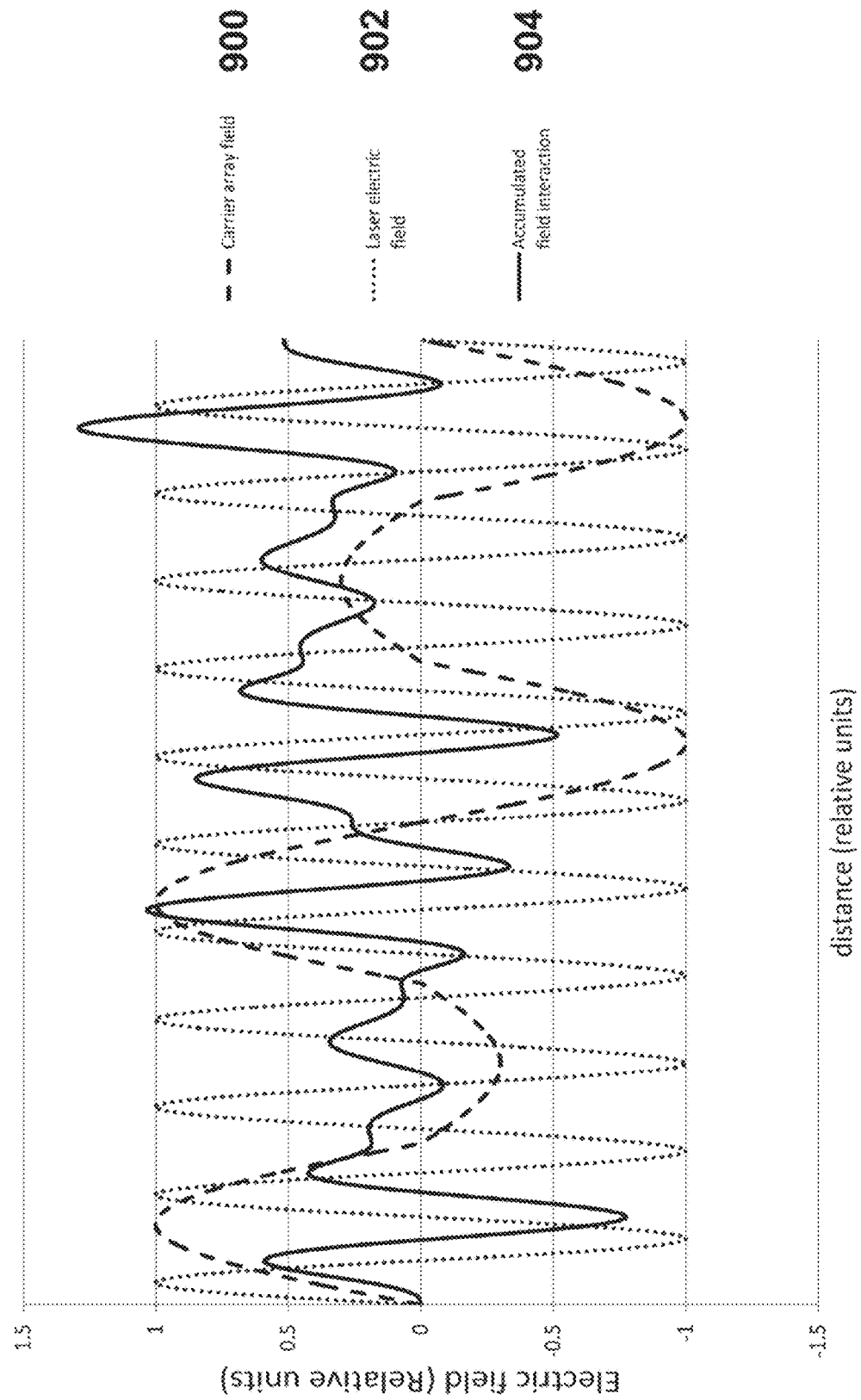
FIG. 9 is a schematic diagram illustrating the relationship between the electric fields employed in the present invention, free space case.

It should be noted that the electric field near a set of charge carriers can be configured such that a non-zero net interaction with the electric field of the laser can be achieved, in the case where the laser is directed to travel proximate and perpendicular to the charge carriers in free space, with no optics in the laser beam path. A schematic is shown in FIG. 9. In this case, the charges on a set of separate carriers (e.g. a set of parallel traces on a PCB) are configured to achieve a non-sinusoidal electric field variation in the direction of laser travel (900). The electric field of the laser beam (902) is shown schematically over the same distance. In such a case, the space integral (904) of the electric field near the charge carrier array (900) and the electric field of the laser (902) can be a non-zero value.

Figure 10:
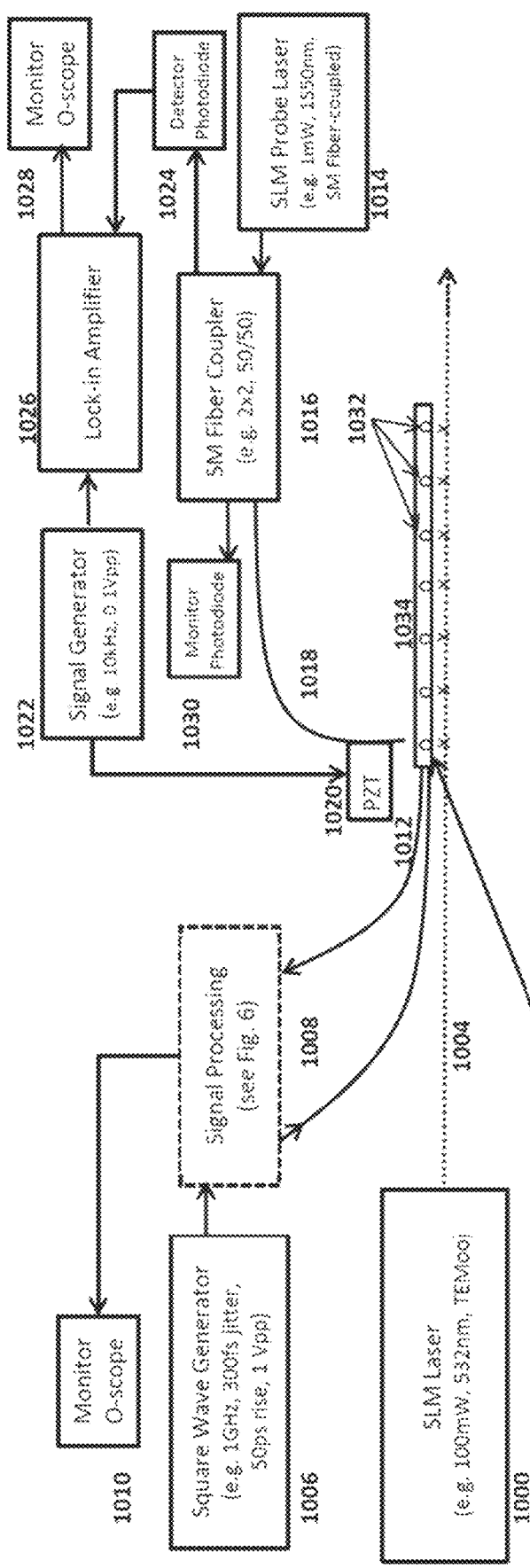
FIG. 10 is a schematic diagram illustrating a preferred embodiment of the present invention employing a continuous wave single frequency laser and a field carrier array, free space case.

FIG. 10 shows a schematic where a set of field carriers (e.g. a set of wire cantilevers, or alternatively a series of traces on a printed circuit board) (1032) is arrayed perpendicular to and along a laser's (1000) propagation path (1004). The field carriers shown share a common platform (1034), so a single interferometric detection measurement (1014-1030) is sufficient to measure the cumulative force on the ensemble of field carriers.

As the circuit path for each carrier (1032) is unique, each field carrier signal wave must have separate phase control to facilitate the desired effect. The phases are adjusted to maximize the force detected via the interferometric detector signal described above.

Jitter Reduction Circuit With Combiner Embodiment

Figure 11:
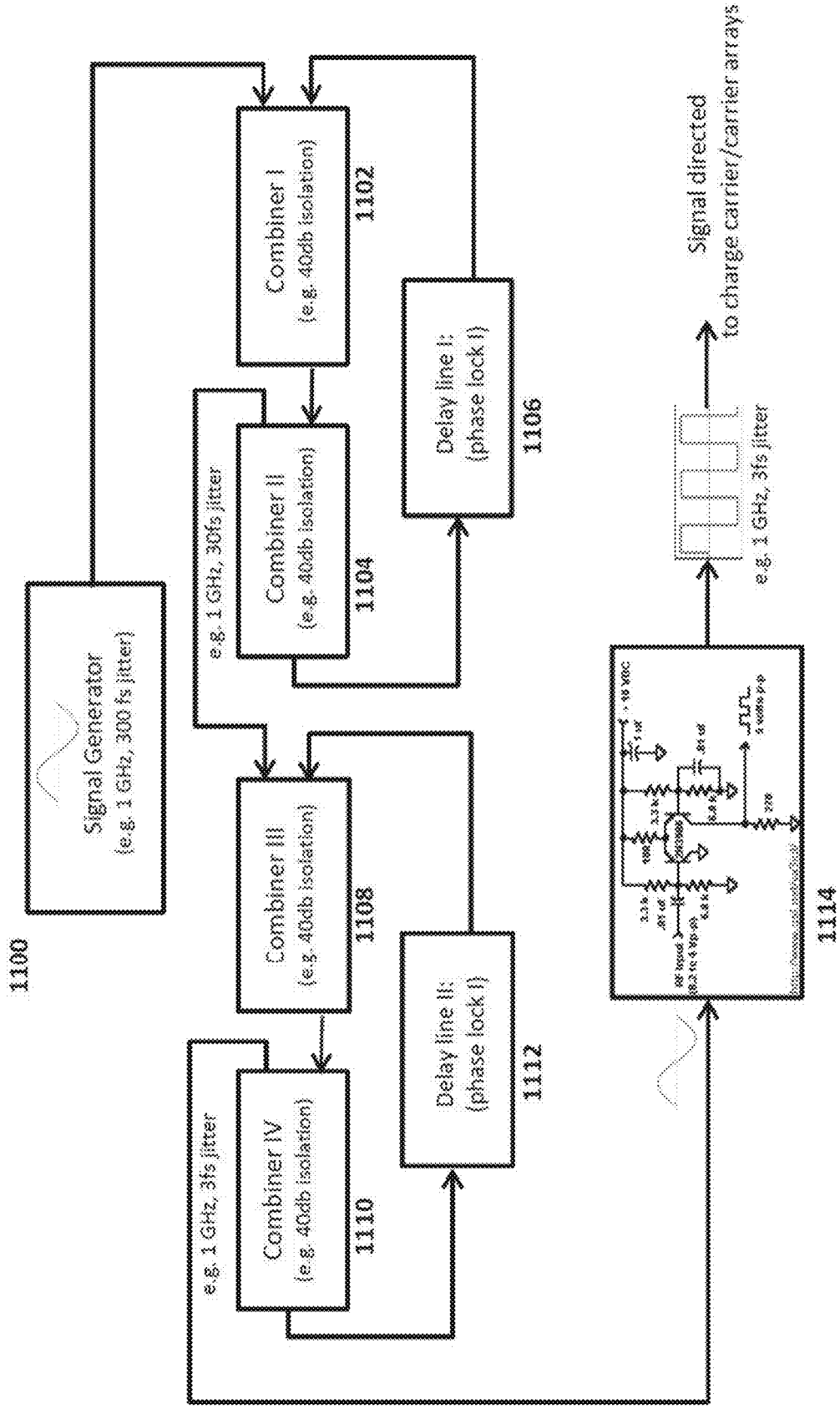
FIG. 11 is a schematic of a circuit that is configured to process a commercially available sinusoidal signal into a signal sufficient to induce a measurable force between a continuous wave single frequency laser and a conductive wire cantilever: combiner case.

FIG. 11 shows a schematic of an alternate embodiment of a circuit to reduce jitter in an electronic signal, the first embodiment having been presented in FIG. 6. In FIG. 11, a sinusoidal signal generator (e.g. 1 GHz, 300 fs jitter) (1100) is directed into a first input port of a first signal combiner (1102). The first signal combiner (1102) provides an isolation (e.g. 40 db) between the two input ports of the combiner (1102). The output of the first combiner (1102) is directed into the first input port of a, similar, second combiner (1104). The output of the second combiner (1104) is directed to the input of a first adjustable delay line (1106) and the output of the first delay line (1106) is directed into the second input port of the first combiner (1102), thereby creating a feedback loop that propagates through the first delay line (1106). When the delay line (1106) is adjusted such that the length of one round trip through the circuit (1102, 1104, and 1106) is an integral multiple of the wavelength of the signal from the signal generator (1100), the feedback loop serves to reduce both the jitter and amplitude noise of the input signal by the square root of the number of round trips through the circuit, determined by the isolation values of the combiners (1102 and 1104). As an example, if the combiners serve to transmit ninety nine percent of the signal from the first combiner input port to the combiner output port and one percent of the signal exits through the second input port of the combiner, a result of imperfect isolation, the number of round trips through the feedback loop would be approximately ninety eight. In such a case the noise in the above circuit would be reduced by the square root of approximately ninety eight, or nearly ten-fold.

In FIG. 11, a second combiner set is shown (1108 and 1110). The purpose of the second combiner set (1108 and 1110) is to reduce the signal noise further. The signal from the second input of the second combiner (1104), the leakage from the second combiner, is directed to the first input port of a third signal combiner (1108). The output of the third combiner (1108) is directed to the first input port of a fourth combiner (1110) and the output of the fourth combiner is directed to the input of a second adjustable delay line (1112). The output of the second delay line (1112) is directed to the second input of the third signal combiner (1108), thereby creating a second feedback loop. The length of the second feedback loop is adjusted to be an integral multiple of the wavelength of the signal from the signal generator (1100). Thus the second set of combiners (1108 and 1110) and the second delay line (1112) serve to further reduce the signal noise from the output of the second signal combiner (1104) (e.g. by a further factor of 10)

The signal, leakage, from the second input port of the fourth signal combiner (1110) is directed to a commercial circuit (1114) that converts a sinusoidal signal to a square wave signal, thus providing the signal upon the charge carriers in FIGS. 7, 8 and 10 (712, 812/832, and 1012/1032, respectively) sufficient to induce a measurable force between a continuous wave single frequency laser and a conductive charge carrier or series of charge carriers.

Figure 12:
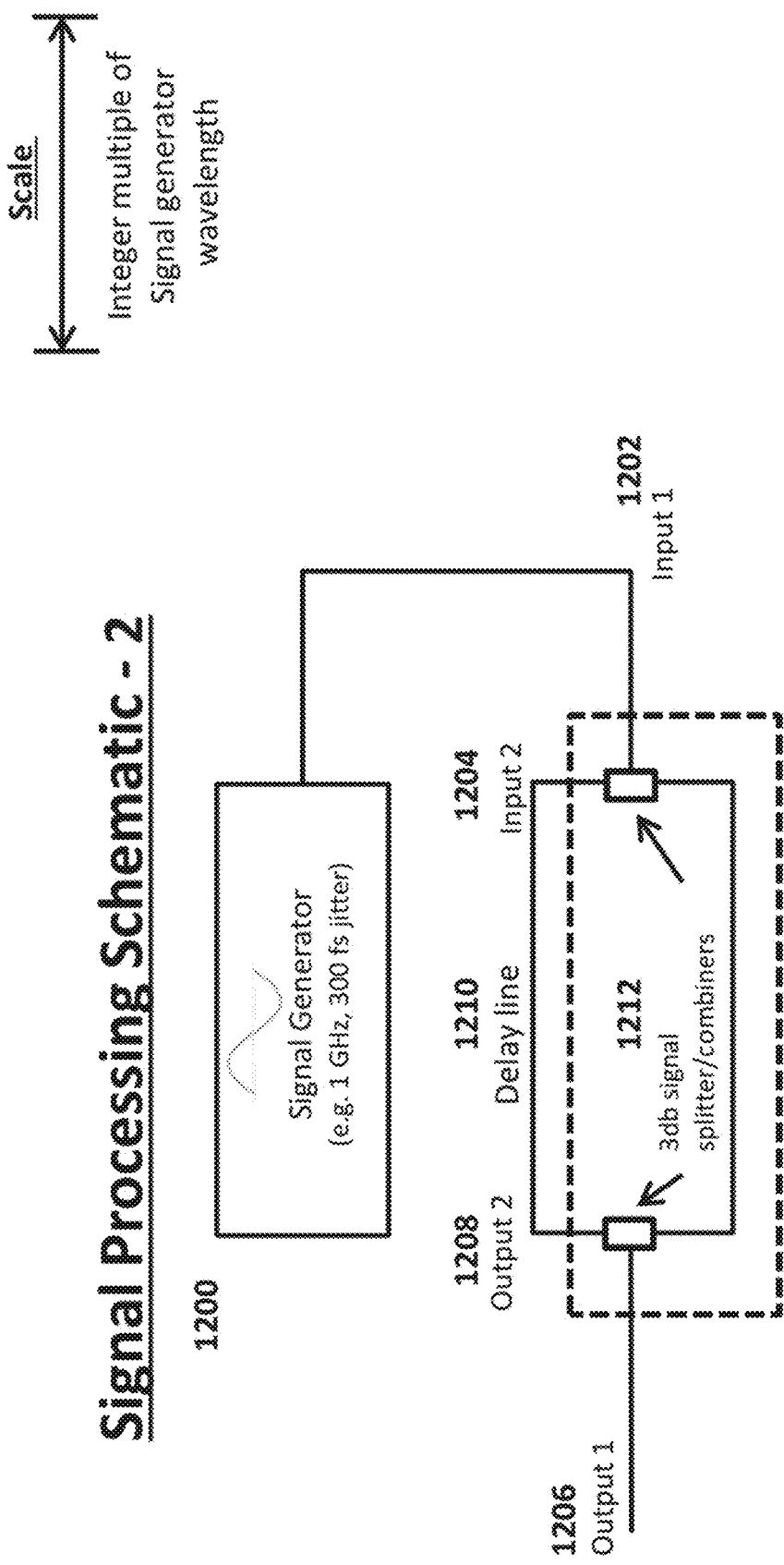
FIG. 12 is a schematic of a circuit that is configured to improve the noise/jitter of a commercially available sinusoidal signal generator.

FIG. 12 is a schematic of a circuit that is configured to improve the noise/jitter of a commercially available sinusoidal signal generator. In the embodiment of FIG. 11, the circuit employs high discrimination (e.g. 40 dB) splitter/combiners to improve the noise/jitter on a periodic electrical signal. In the embodiment of FIG. 12, low discrimination splitter/combiners (e.g. 3 dB) are employed to achieve a similar result as in the embodiment of FIG. 11. The signal from a signal generator (1200) is directed into a circuit with 2 inputs (1202 and 1204) and 2 outputs (1206 and 1208), where the second output is directed to the second input and connected thereto by a delay line (1210). In the case in FIG. 12, the internal circuit consists of 2 beam splitters (1212) (e.g. 3 dB). When the circuit is configured such that each potential path available to the input signal is an integer multiple of the wavelength of the input signal, the circuit will reduce the noise/jitter in the input signal by the square root of the additive waves. In the case of FIG. 12, assuming 3 dB splitter/combiners, ~⅔ of the input signal would be transmitted to the first output and the noise/jitter of the output signal would be ~15% lower than the noise/jitter of the input signal.

In one embodiment, the distance of the electrical paths between the two signal splitters is not equal. Rather, one side is a non-zero integer multiple of the input signal wavelength longer than the other. In such a case the noise/jitter reduction of the output signal would be greater, ~50% in the present case.

Figure 13:
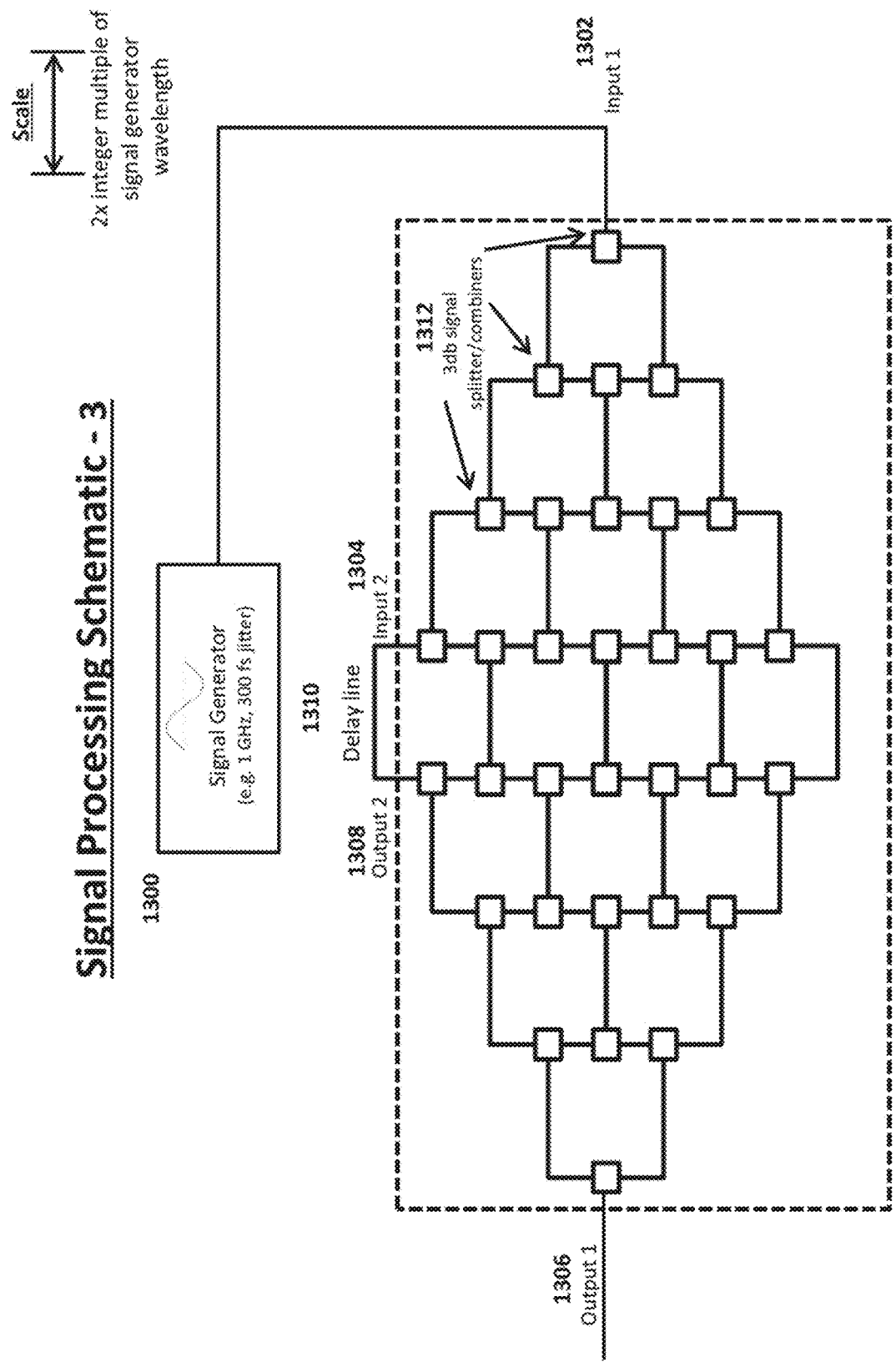
FIG. 13 is a schematic of a circuit that is configured to process a commercially available sinusoidal signal, reducing the noise/jitter, into a signal sufficient to induce a measurable force between a continuous wave single frequency laser and a conductive wire cantilever.

FIG. 13 shows another embodiment of the noise/jitter reduction circuit. The signal from a signal generator (1300) is directed into a circuit with 2 inputs (1302 and 1304) and 2 outputs (1306 and 1308), where the second output (1308) is directed to the second input (1304) and connected thereto by a delay line (1310). In the case in FIG. 13, the internal circuit consists of a multiplicity of signal splitter/combiners (1312) (e.g. 3 dB) arranged such that each circuit path available to the input signal is an integer multiple of the wavelength of the input signal. In such a case, the signal can be split a multitude of times, each split signal element traveling along a circuit path that is an integer multiple of the wavelength of the signal, and recombined with other split elements a multitude of times, each recombination event averaging out and reducing the noise/jitter of the signal. The signal at the first output of the circuit can see substantial (e.g.>100 fold) decrease in the noise/jitter when compared to the input signal.

In one embodiment, the distance of the electrical paths within the array of signal splitters are not uniform. Rather, the distances are a non-zero integer multiple of the input signal wavelength. In such an embodiment, the noise/jitter reduction efficiency of the circuit would be improved due to the improved variance in the recombination process. That is, each recombination would tend to occur with a signal element more widely distributed throughout the signal chain.

Field Phase and Amplitude Induced Modulation Embodiments

In prior embodiments, a force between a radiation field, a laser, and a charge carrier is achieved by varying the charge on the charge carrier in a manner that is synchronous with the oscillation of the electric field of the laser beam. In another embodiment, an appropriate modulation is induced to the laser field phase and amplitude and the charge on the charge carrier is held constant. This approach can improve the efficiency of the force generation as well as the cost and manufacturability of devices using the approach to achieve force generation.

In this additional embodiment, two or more sources of radiation are employed. For the sake of simplicity, the first case is described where two laser sources are employed. For example, one 1550 nm laser source and one near 1300 nm laser source. These values are selected for several reasons related to commercial availability, including 1) they are common in the telecommunications industry, 2) they can be very low cost ($5), 3) their power can be quite high (200 mW), and 4) they can be manufactured to be extremely small (<<1mm^2)

There are three optical phenomena that are required to achieve the synergistic laser amplitude and phase modulation necessary to generate a force on a charge carrier with a constant charge: 1) optical pulsing, 2) the optical Kerr effect, and 3) optical dispersion.

Optical Pulsing

Figure 14:
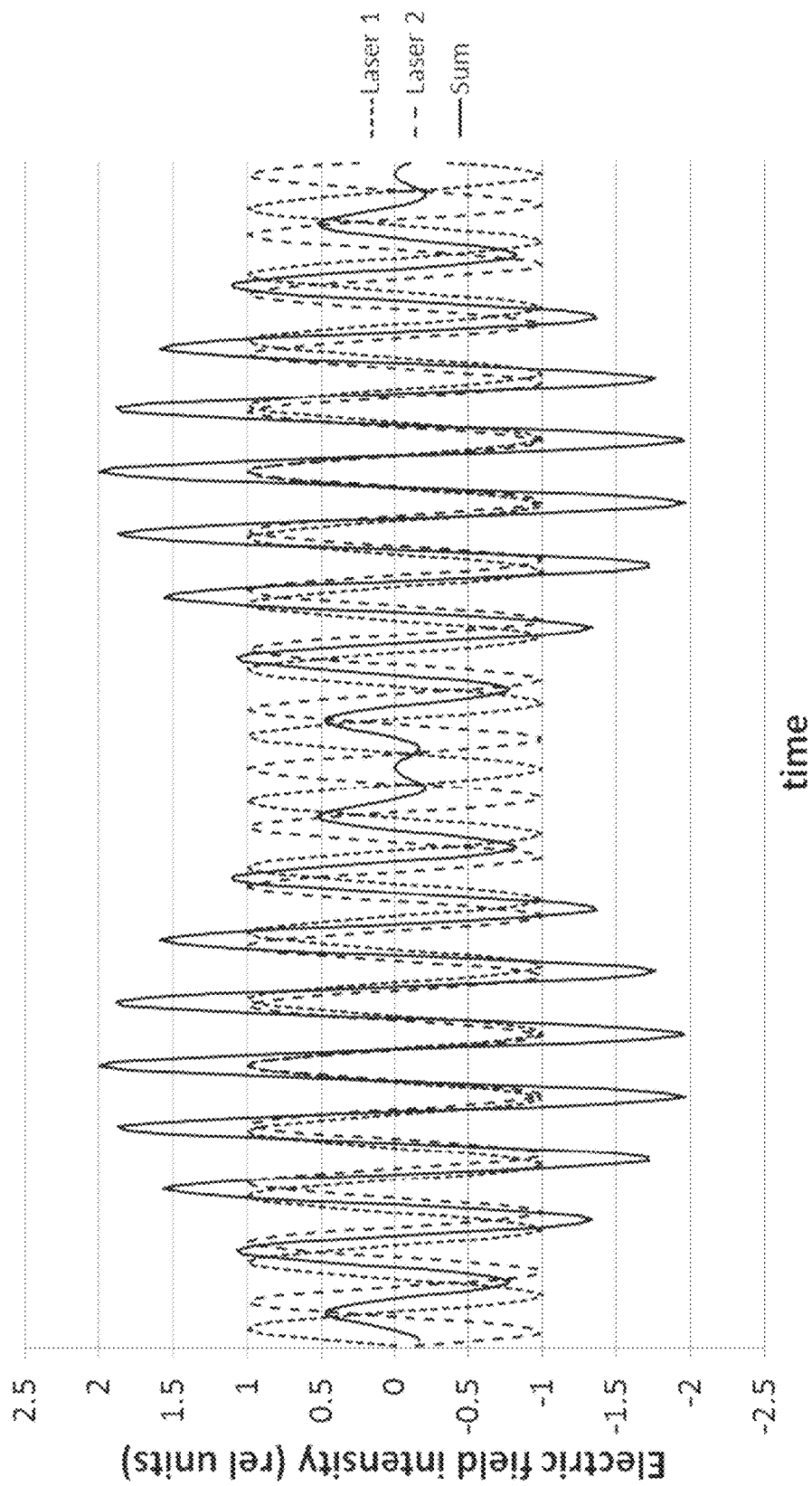
FIG. 14 is a schematic illustrating two co-propagating lasers forming a pulse train

In the current case, optical pulsing is achieved by co-propagating two lasers of different wavelengths (e.g. 1550 nm and 1300 nm). FIG. 14 shows a schematic of the electric fields generated when two lasers, of different wavelengths, are combined, made collinear, and directed to propagate in the same direction. Because of the differences in wavelength, the two lasers oscillate between the states where they are in-and-out of phase, the amplitude envelope oscillating between zero and one. This creates a pulse train, the pulse rate of which is determined by the wavelength spacing between the two lasers.

Optical Kerr effect

Many optical media (e.g. optical fibers used in the telecommunications industry) manifest the optical Kerr effect, the phenomenon wherein the optical index of the medium (the speed at which light travels through the medium) is a function of the intensity of the light itself. When very high intensity light is used (e.g. laser light) this change to the optical index can become substantial.

Figure 15:
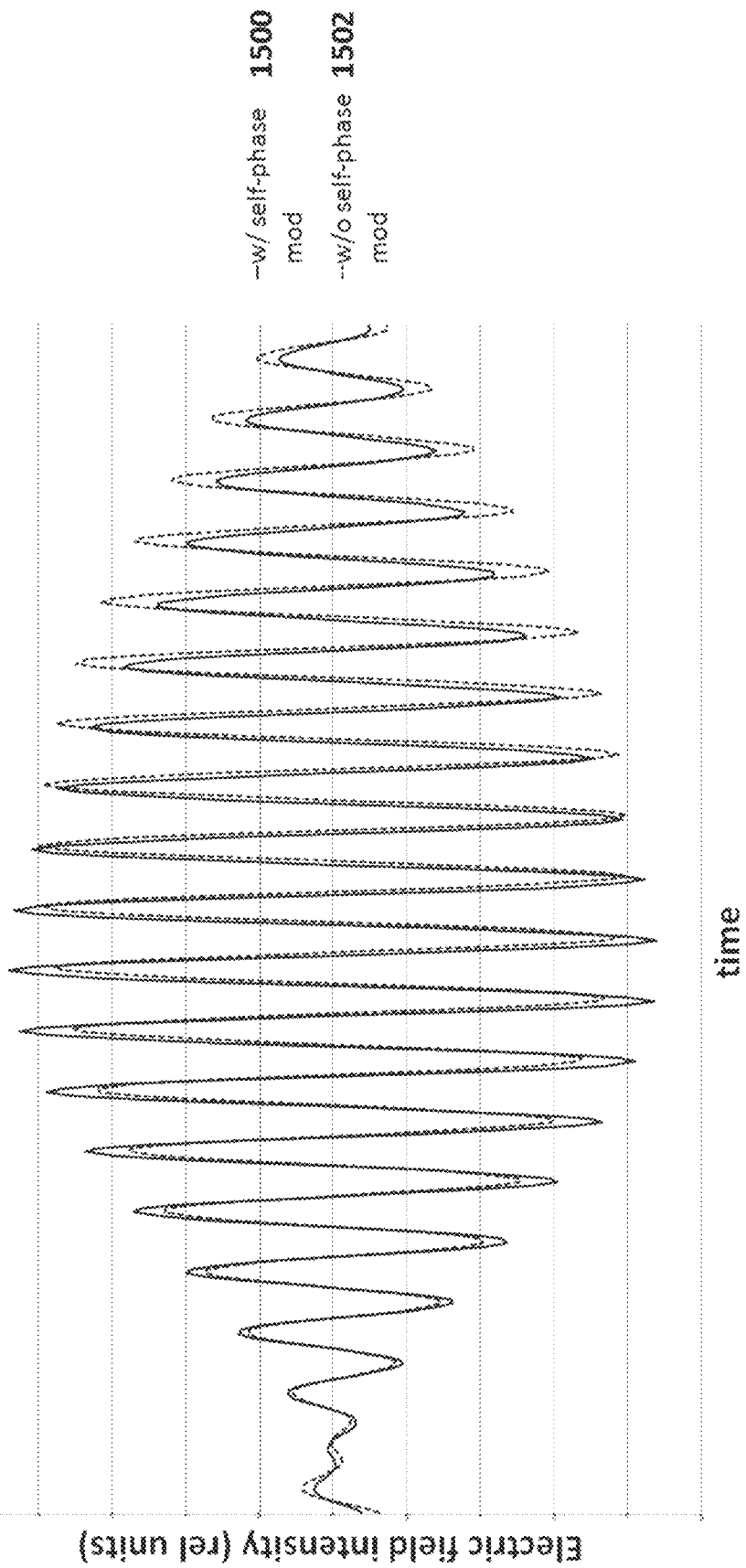
FIG. 15 is a schematic illustrating the effect of self-phase modulation on an optical pulse. The phase of the center area of the pulse is delayed with respect to the outer edges of the pulse.

In the case of optical pulses, the Kerr effect often gives rise to 'self-phase modulation.' This phenomenon distorts the pulse as shown in FIG. 15, wherein the phase modulated pulse (1500) is offset from the unmodulated pulse (1502). The leading and trailing edges of the optical pulse, the low intensity parts of the pulse, experience a lower index of refraction and thus travel more quickly through the medium than the center part of the optical pulse, the higher intensity part of the pulse, which experiences a higher index of refraction and thus travels more slowly through the medium.

Optical Dispersion

Optical dispersion is the phenomena wherein different wavelengths of light travel through a given medium at different speeds. This is distinguished from the Kerr effect above in that it is not, to first order, a function of light intensity, but only of the wavelength of the light traveling through the medium. For example, in the case of an optical medium with positive dispersion, light at 1550 nm will travel through the optical medium more quickly than light at 130 0nm.

Figure 16:
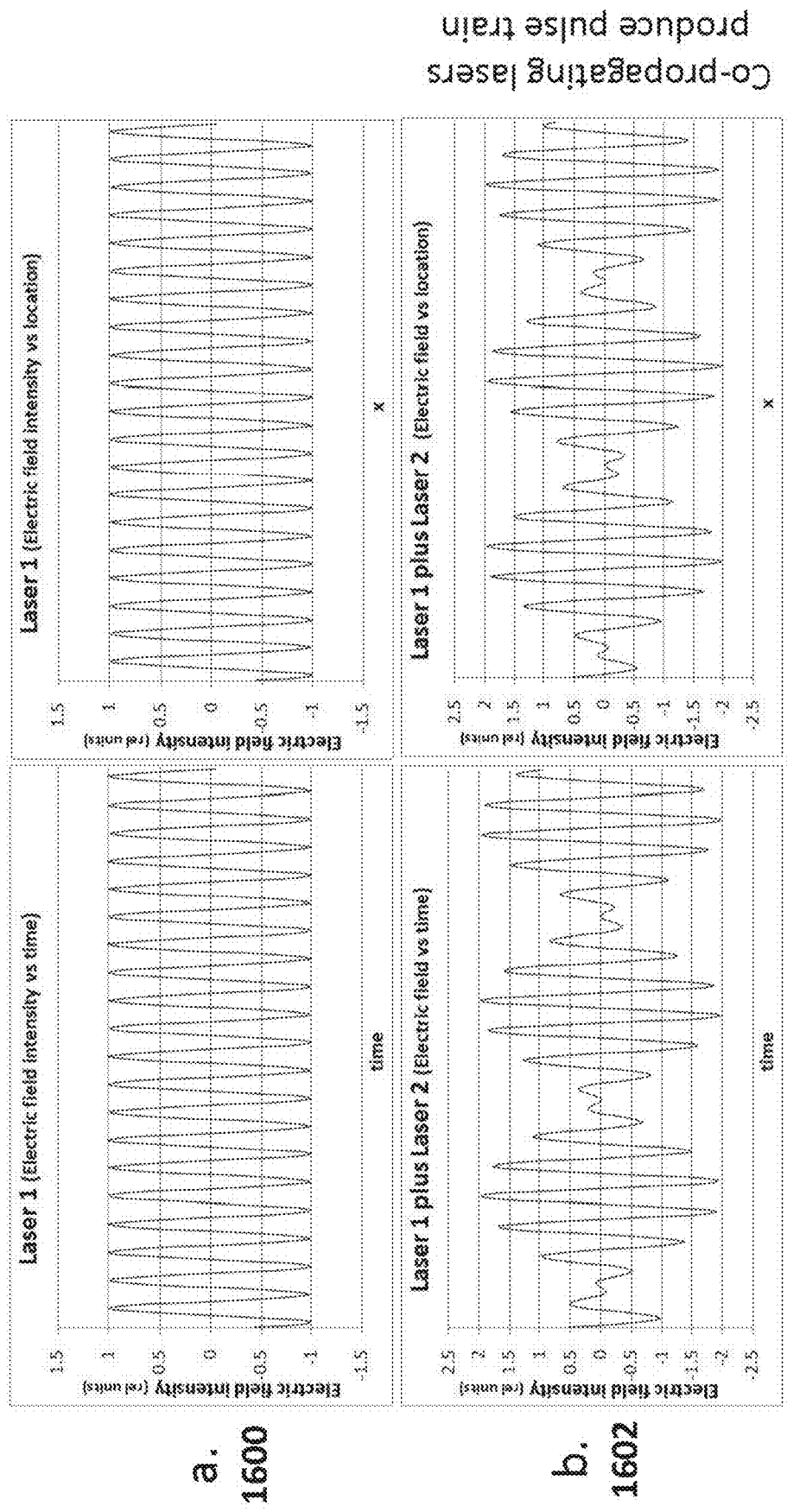
FIG. 16 shows schematics of the laser electric fields in the single mode and pulsed cases.
Figure 17:
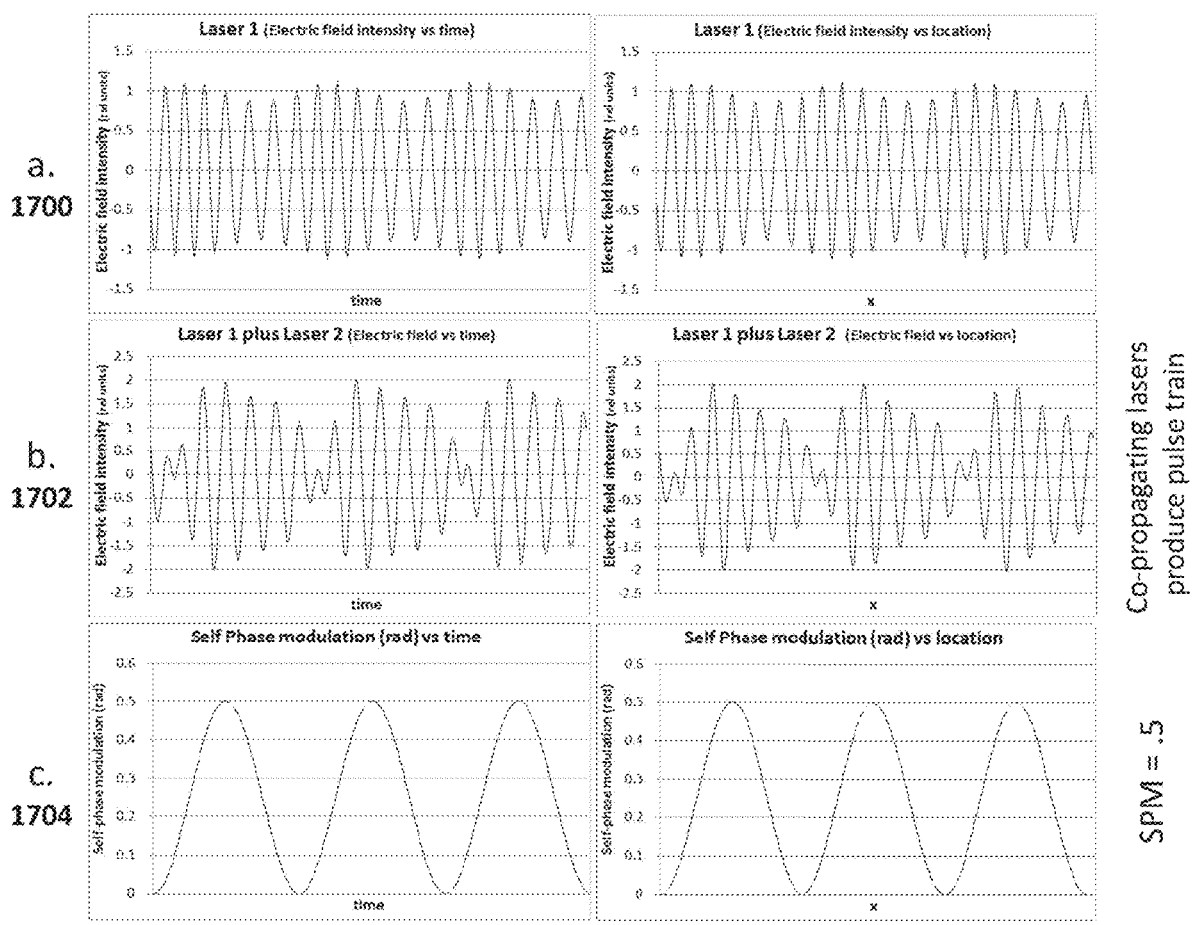
FIG. 17 shows schematics of the laser electric fields in the single mode and pulsed cases, as well as a schematic of the phase modulation, under conditions where phase modulation is present.
Figure 18:
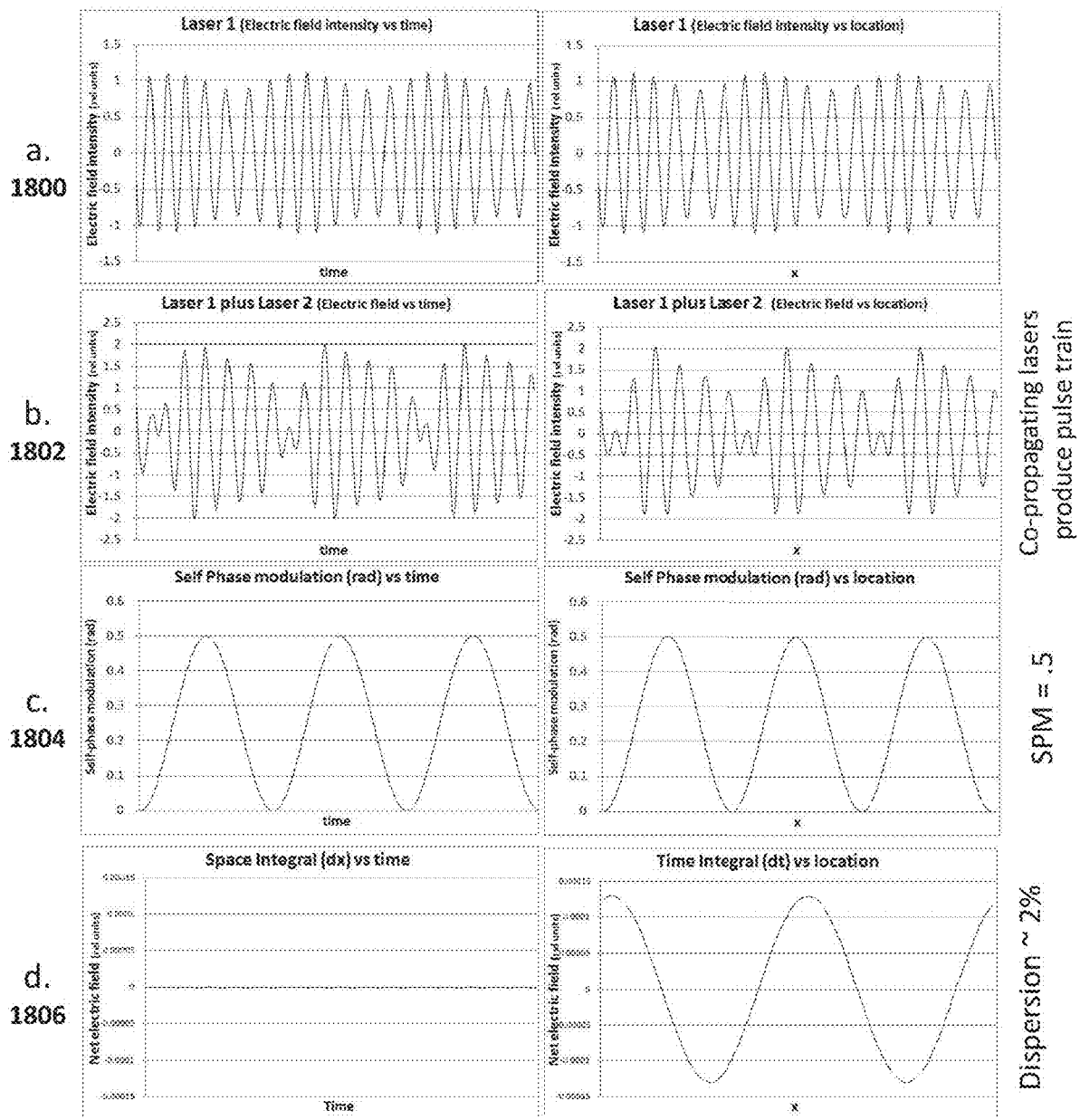
FIG. 18 shows schematics of the laser electric fields in the single mode and pulsed cases, as well as schematics of the phase modulation and space and time integrals, under conditions where phase modulation and dispersion are present.

FIGS. 16-18 show a series of traces that illustrate the current embodiment.

FIG. 16 shows a schematic of a) the electric field of a single laser beam, both in time and space (1600). b) the electric field of a pulse train created when a second laser, of a different wavelength, is made co-propagating with the first (1610). In the example of FIG. 16, the wavelength of the second beam is 85% the wavelength of the first. This would be the case if the wavelength of the first laser was 1550 nm and the wavelength of the second laser was 1317.5 nm.

FIG. 17 shows a schematic of a) the electric field of a single laser beam, both in time and space, when we have introduced a phase modulation, of 0.5 radians peak (1700). b) the electric field of a pulse train created when a second laser, of a different wavelength like that in FIG. 16, is made co-propagating with the first and in the case where we have introduced a phase modulation, of 0.5 radians peak (1702). c) A graphic of the magnitude of the induced phase modulation, in time and space (1704).

FIG. 18 shows a schematic of a) the electric field of a single laser beam, both in time and space, when we have introduced a phase modulation, of 0.5 radians peak, and dispersion, ~2%, to the model (1800). b) the electric field of a pulse train created when a second laser, of a different wavelength like that in FIGS. 16 and 17, is made co-propagating with the first and in the case were we have introduced a phase modulation, of 0.5 radians peak, and dispersion, ~2% (1802). c) A graphic of the magnitude of the induced phase modulation, in time and space (1804). d) the integral of equivalent phase space window, 36 radians in space and 40 radians in time due to the refractive index used in the model, in both time and space for the pulse train shown in 18*b*) (1806). It can be seen from 18*d*) (1806) that, although the integral through space, for the given phase space window, is zero at any given time, the integral through time, for the given phase space window, is non-zero at some spatial positions.

FIG. 18 illustrates that, when dispersion is present and consequently the two lasers travel through the optical medium at different speeds, each successive pulse manifests in a different phase, linearly incremented from the previous pulse. This, in conjunction with judicious phase modulation, affords the opportunity to arrange the constructive and destructive interferences to selectively/preferentially reoccur in a given spatial location.

As an example, if we were to measure the electric field at a location near the middle of the second, spatial trace in FIG. 18*d*), a location where the time integral is positive, we would measure a net, positive, electric field as a function of time.

If we were to place a charge at the above location, near the middle of the second, spatial, trace in FIG. 18*d*), a location where the time integral is positive, that charge would experience a net force, proportional to its charge and the net magnitude of the electric field manifested at the selected position. Additionally, if we placed a charge of opposite sign at a location near the ¼ point of the second, spatial, trace in FIG. 18*d*), a location where the time integral is negative, that charge would experience a net force, proportional to its charge and the magnitude of the electric field manifested at that selected position.

In this example, the spacing between adjacent maxima and minima in FIG. 18*d*) is 9 times the wavelength of the laser used in the schematic and that the schematics are to scale in the time and spatial dimensions. This means that, in the case of a ~1.5 um laser, the adjacent maxima and minima in FIG. 18*d*) would be ~13 um, well within the manufacturing capabilities of modern IC, and even TFT, processes. This, as well as the abovementioned device availability, affords a strong opportunity to exploit the present embodiment on practical device scales.

The goal of the present embodiment is to create conditions wherein the integral through time, for a given phase space window, is non-zero at some spatial positions. Below, we draw note to some degrees-of-freedom, not apparent in the figures, that can facilitate those conditions.

1) A laser's phase is modulated asynchronously to its own phase. This can be accomplished when a first set, of two, lasers is configured to give rise to a pulse train which modulates the refractive index of the optical medium, while a third, laser (e.g. crossed with, but not co-propagating with the first two) experiences the induced phase modulation. Since each laser, of the three, can have a different wavelength, (e.g. the third laser has a wavelength of 1550+1 nm) the phase of the third laser can be uncorrelated with the induced phase modulation generated by the first two lasers.

2) The third laser's amplitude is modulated apart-and-separate from the phase modulation. This can be accomplished by either electronic or optical means. An example of the optical case would be a fourth laser source (e.g. 1317.5+2 nm) made to be co-propagating with the third laser, discussed in 1), above. If the fourth laser is of equal power, the pairing would result in a pulse train, but if the power levels are offset (e.g. the fourth laser having substantially lower power than the third), the amplitude modulation can be tuned to optimize the desired effect.

Figure 19:
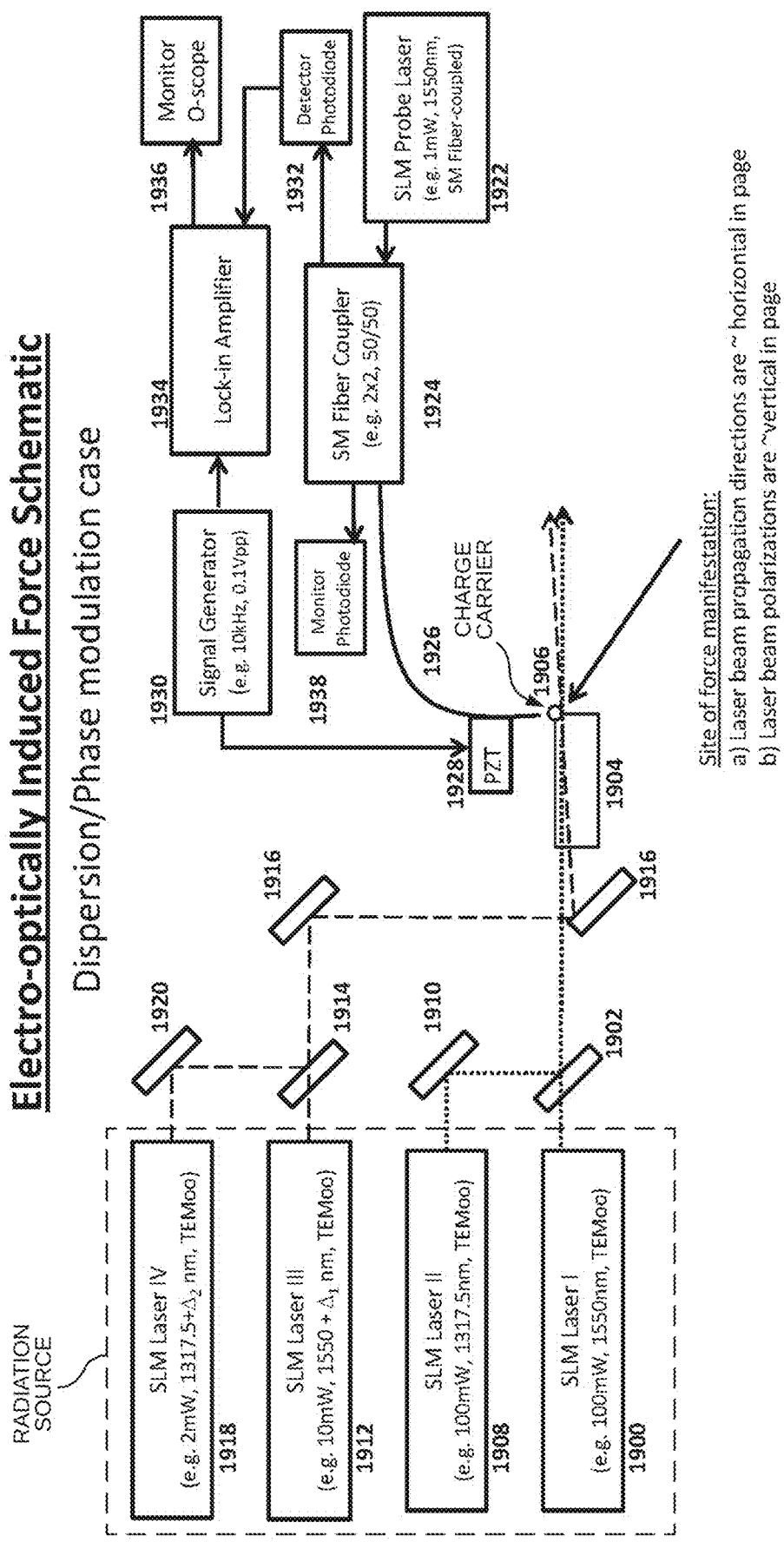
FIG. 19 is a schematic diagram illustrating an embodiment of the present invention employing four continuous wave single frequency lasers and a single charge carrier.

FIG. 19 shows a schematic illustrating one embodiment of the present invention.

A single longitudinal mode (SLM) laser, Laser I (1900), is directed through a beam combining optic (1902) and into an optical medium (1904) chosen with specific dispersion and non-linear optical susceptibility (i.e. optical Kerr effect). Laser I (1900) is then aligned to be proximate to a small charge carrier (e.g. microns in width) (1906). A second SLM laser, Laser II (1908), is routed with beam steering optics (1910), reflected off the beam combiner (1902), and aligned to be co-propagating with the first laser (1900). In this embodiment, Lasers I (1900) and II (1908) give rise to a pulse train and consequently a periodic modulation of the index of refraction in the optical medium (1904).

A third SLM laser, Laser III (1912), is directed through a beam combining optic (1914), routed with beam steering optics (1916), and made to cross with Lasers I (1900) and II (1908) within the optical medium (1904), proximate to the charge carrier (1906). In this embodiment, Laser III (1912) is configured to experience the periodic modulation of the index of refraction within the optical medium (1904) created by Lasers I (1900) and II (1908).

A fourth laser, Laser IV (1918), is routed with beam steering optics (1920), combined with Laser III (1912) with beam combiner (1914), and aligned to be co-propagating with Laser III (1912). In this embodiment, Laser IV (1918) is used to modulate the amplitude of Laser III (1912), through constructive and destructive interference, to optimize the force measured upon the charge carrier (1906).

The interferometric force detection system is similar to that described earlier in this submission. A fiber optic force detection system similar to that used in atomic force microscope studies (D. Rugar, H.J. Mamin, and P. Guethner, Appl. Phys. Lett. 55, 25, (1989) 2588) is employed here to measure force induced between a wire cantilever charge carrier (1906) and a laser beam (1912).

The output of a single-mode fiber-coupled probe laser (1922) is directed into a single mode 2×2 fiber coupler (1924). One optically cleaved end of the output fiber (1926) of the fiber coupler (1924) is positioned in close proximity (e.g. single microns) and perpendicular to the wire cantilever (1906). A piezoelectric actuator, PZT (1928) is attached to the optical fiber (1926) and driven by a signal generator (1930). The PZT (1928) drives the motion of the optical fiber (1926) perpendicular to the wire cantilever (1906).

The single frequency laser light exiting the output of the fiber coupler (1926) is made incident upon the wire cantilever (1906). A portion of the light exiting the optical fiber (1926) and incident on the wire cantilever (1906) is reflected back into the optical fiber (1926) and co-propagates with the light reflected from the internal surface of the optically cleaved fiber (1926).

The return signal, the optical interferometric signal between the counter propagating reflection of the optically cleaved end of the optical fiber (1926) and the reflective surface of the wire cantilever (1906), travels back through the optical fiber (1926), back through the fiber coupler (1924), and is directed into a detector photodiode (1932). The output of the detector photodiode (1932) is measured using a lock-in amplifier (1934), using the reference signal from the signal generator (1930) driving the PZT (1928). The signal from the lock-in amplifier (1934) is observed on a monitor oscilloscope (1936). A monitor photodiode (1938) can be employed to measure the second output of the fiber coupler (1924) to ensure system stability.

The constructive and destructive interference between the light reflected from the internal surface of the optically cleaved fiber (1926) and the light reflected from the wire cantilever (1906), driven and detected at the frequency of the lock-in amplifier (1934), allows for a very sensitive detection of movement of the wire cantilever (1906) (e.g. nanometers). When the wire cantilever (1906) is chosen with a small force constant, this allows for very sensitive force detection (e.g. nanoNewtons).

FIGS. 20-24 show a series of images that illustrate the current embodiment, per FIG. 19.

Figure 20:
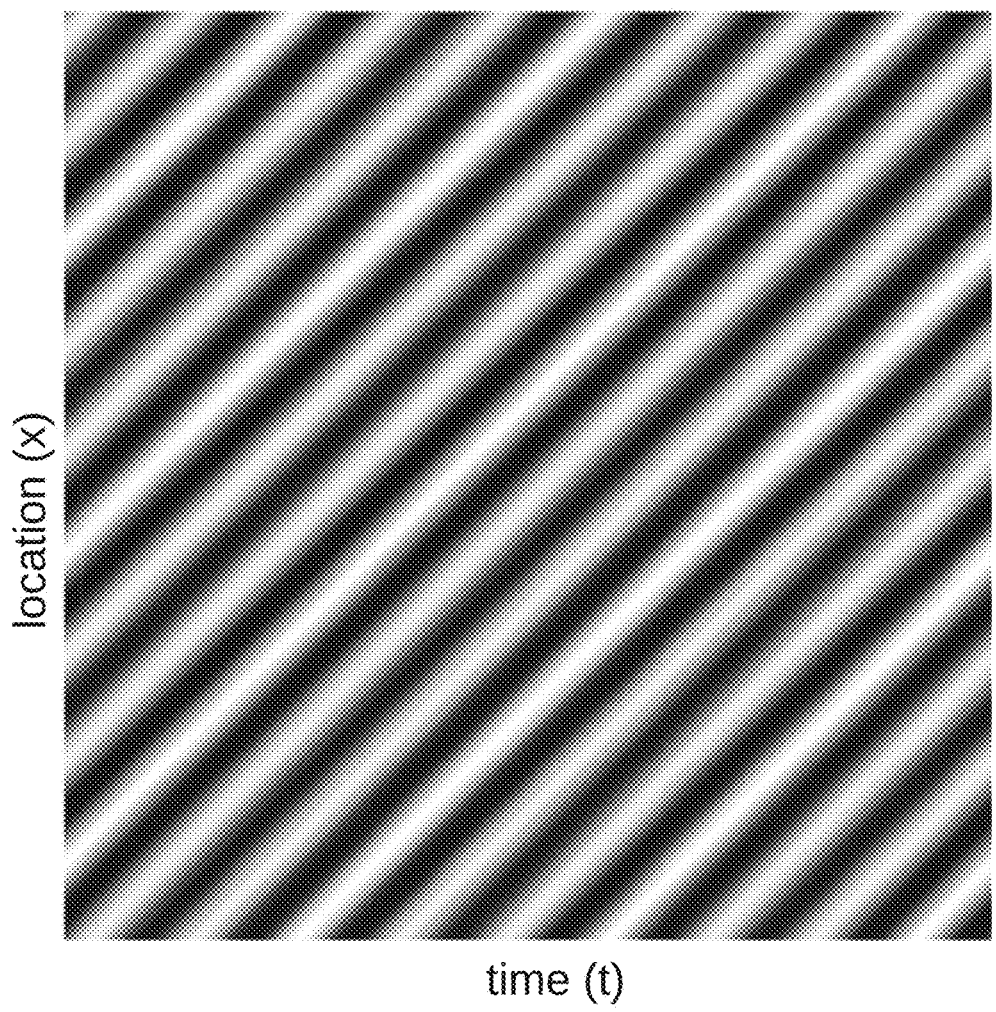
FIG. 20 shows a gray-scale image of the electric field of a propagating laser in both space and time.

FIG. 20 shows a gray-scale image of the electric field intensity of a single laser beam (e.g. laser III (1912) in FIG. 19) plotted both in space and time. In the gray-scale image, black represents an electric field pointed into the plane of the page (relative field intensity equal to minus one) and white represents an electric field pointing out of the plane of the page (relative field intensity equal to plus one). In FIG. 20, the model includes no phase modulation and no dispersion. The electric field anti-nodes are diagonal in the image, denoting and 'equal speed/frequency' in both space and time.

Figure 21:
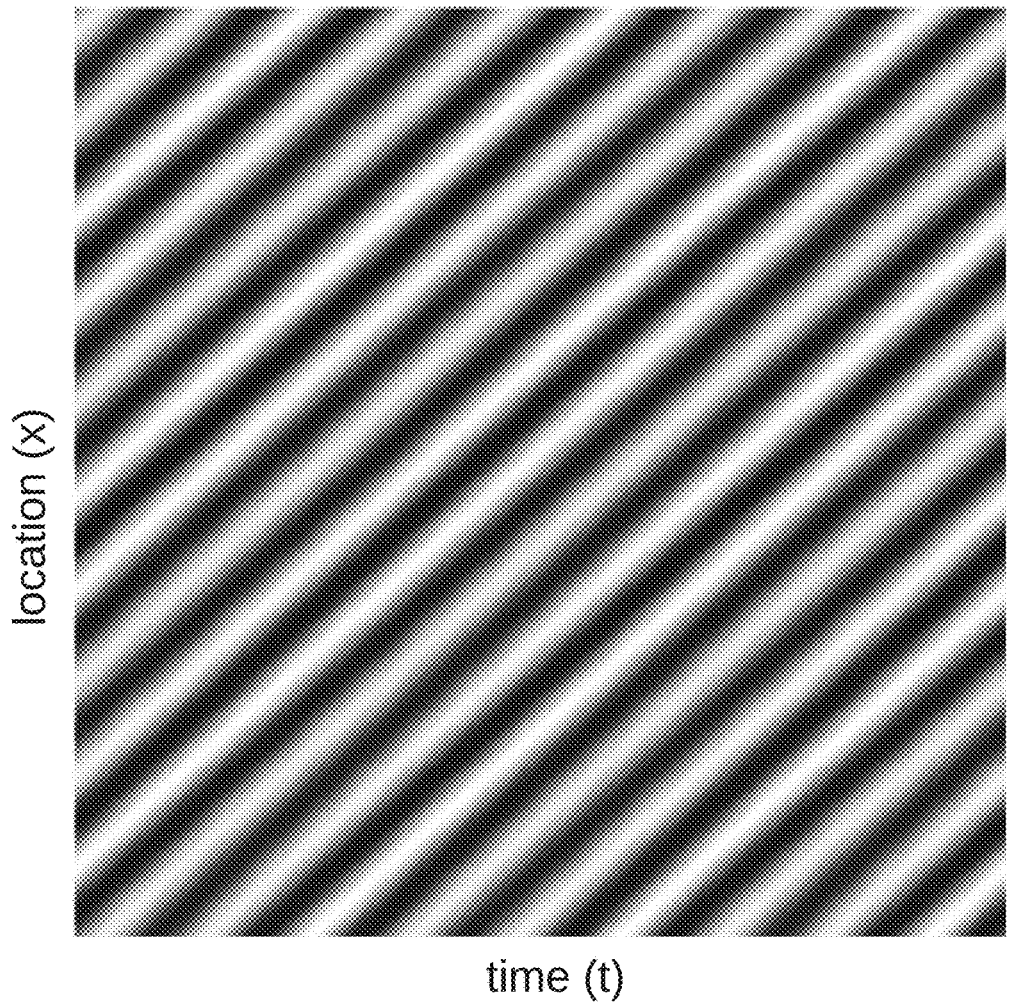
FIG. 21 shows a gray-scale image of the electric field of a propagating laser in both space and time, when dispersion is present.

FIG. 21 shows a gray-scale image of the electric field intensity of a single laser beam (e.g. laser III (1912) in FIG. 19) plotted both in space and time. In FIG. 21, the model includes no phase modulation, but introduces ten percent optical dispersion. The electric field anti-nodes are no longer diagonal in the image, but compressed in the spatial direction, x, denoting reduced speed in space.

Figure 22:
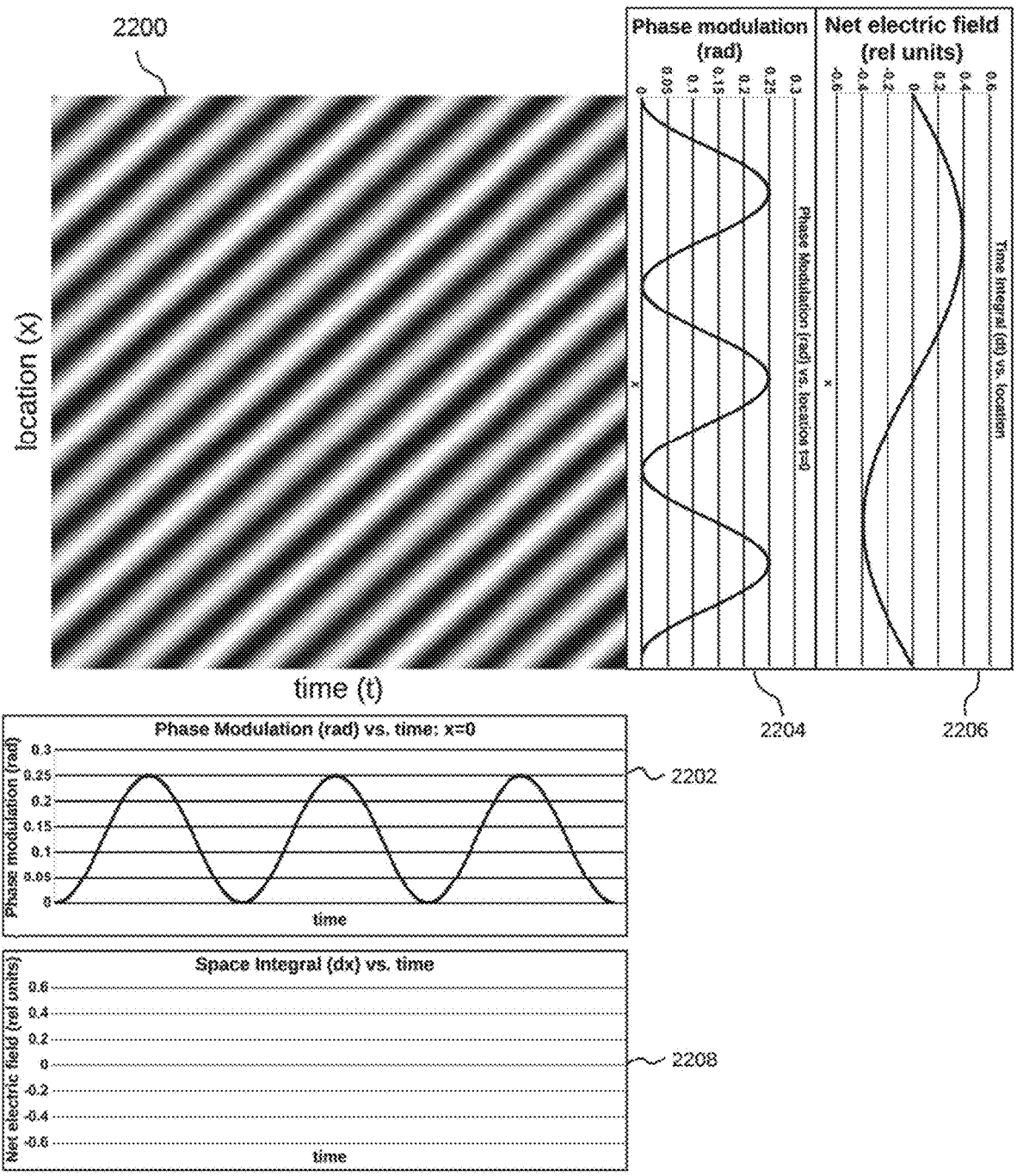
FIG. 22 shows a gray-scale image of the electric field of a propagating laser in both space and time, when dispersion and phase modulation are present.

FIG. 22 shows a gray-scale image (2200) of the electric field intensity of a single laser beam (e.g. laser III (1912) in FIG. 19) plotted both in space and time. In FIG. 22, the model includes both phase modulation and optical dispersion. The phase modulation induced in the sample (e.g. by lasers I (1900) and II (1908) in FIG. 19) are shown in time (2202), for x=0, and space (2204), for t=0, in FIG. 22. We note here that, since the lasers (1900 and 1908) giving rise to the phase modulation (2202 and 2204) are separate and distinct from the laser (1912) shown in the gray-scale image (2200) the phase modulation (2202 and 2204) is not correlated, in time or space, to the phase state of electric field shown in the gray-scale image (2200).

FIG. 22 also shows the integral, in both time (2206) and space (2208) for the electric field shown in the grayscale image (2200). It can be seen that, although the integral through space (2208) for the phase space window indicated, is zero at any given time, the integral through time (2206), for the given phase space window, is non-zero at some spatial positions. FIG. 22 illustrates that, with judicious choice of dispersion, amplitude modulation, and phase modulation (e.g. FIG. 19), we can arrange conditions such that a propagating electric field (e.g. laser III (1912) in FIG. 19) can selectively/preferentially manifest in a given spatial location.

Figure 23:
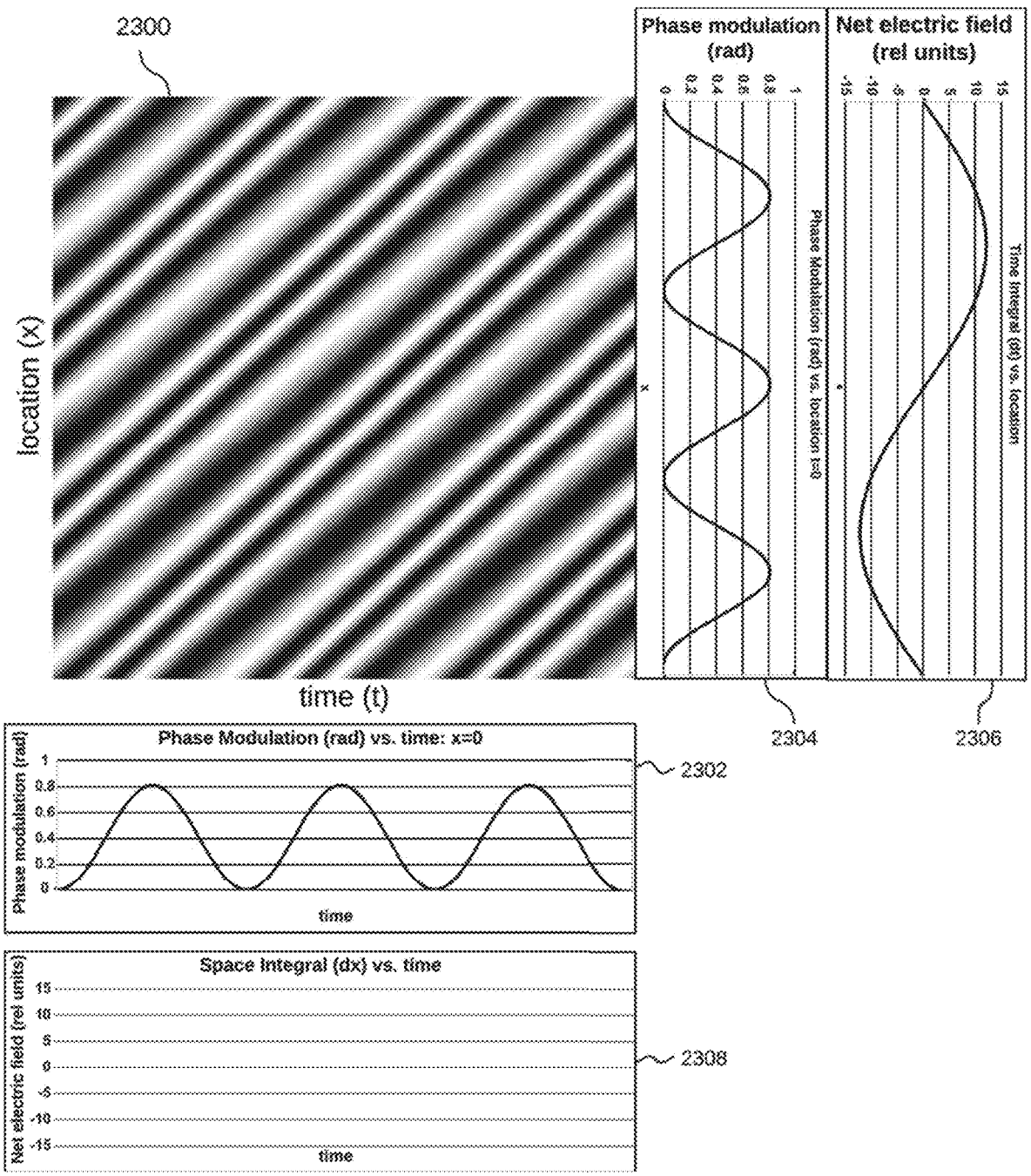
FIG. 23 shows a gray-scale image of the electric field of a propagating laser in both space and time, when dispersion and more exaggerated phase modulation are present.

FIG. 23 shows a gray-scale image (2300) of the electric field intensity of a single laser beam (e.g. laser III (1912) in FIG. 19) plotted both in space and time. In FIG. 23, the model includes both phase modulation and optical dispersion, but, as a visual aid, the phase modulation is exaggerated verses that shown in FIG. 22. The phase modulation induced in the sample (e.g. by lasers I (1900) and II (1908) in FIG. 19) are shown in time (2302), for x=0, and space (2304), for t=0, in FIG. 23. FIG. 23 also shows the integral, in both time (2306) and space (2308) for the electric field shown in the grayscale image (2300). It can be seen that, although the integral through space (2208) for the phase space window indicated, is zero at any given time, the integral through time (2206), for the given phase space window, is non-zero at some spatial positions.

In FIG. 23, the effect is more visually apparent than in FIG. 22. In FIG. 23 the broad, black, features in the gray-scale image, indicating areas where the electric field points into the page, can be seen to correspond with the area of negative net electric field in the time integral plot (2306). Also, the broad, white, features in the gray-scale image, indicating areas where the electric field points out of the page, can be seen to correspond with the area of positive net electric field in the time integral plot (2306). This more clearly illustrates that, with judicious choice of dispersion, amplitude modulation, and phase modulation (e.g. FIG. 19), we can arrange conditions such that a propagating electric field (e.g. laser III (1912) in FIG. 19) can selectively/preferentially manifest in a given spatial location.

Figure 24:
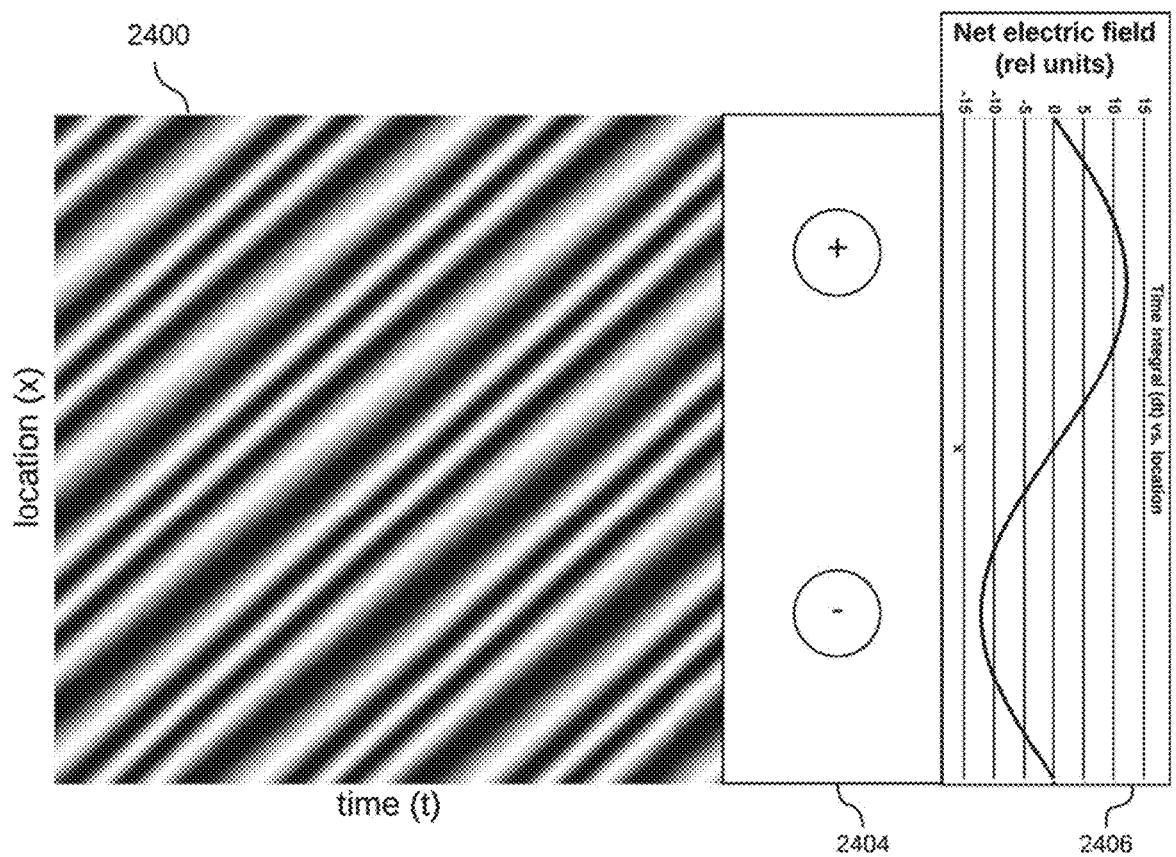
FIG. 24 shows a gray-scale image of the electric field of a propagating laser in both space and time, when dispersion and phase modulation are present, and an example of how charge carriers may be placed, along the 'x' direction, to achieve a net force from the non-zero, time-integrated electric field.

FIG. 24 shows a gray-scale image (2400) of the electric field intensity of a single laser beam (e.g. laser III (1912) in FIG. 19) plotted both in space and time, similar to that of FIG. 22. In FIG. 24, the model includes both phase modulation and optical dispersion, like that in FIG. 22. FIG. 24 also shows the integral, in time (2402) for the electric field shown in the grayscale image (2400). It can be seen from this figure that the electric field integral through time (2202), for the given phase space window, is non-zero at some spatial positions.

FIG. 24 also illustrates how the non-zero electric field integral can be used to induce a net force on a target sample. FIG. 24 shows the placement of a set of charge carriers (2404), along the 'x' direction of laser propagation. The charge carrier with a positive electric charge is placed to correspond with the location that manifests a positive electric field integral (out of the plane of the page). The charge carrier with a negative electric charge is placed to correspond with the location that manifests a negative electric field integral (into the plane of the page). In such an arrangement, both charge carriers would experience a force in the same direction (e.g. into the plane of the page). The net force upon a sample with an array of suitably placed charge carriers will be additive, so a net motive force upon the charge carrier sample can be achieved with a set of lasers and careful selection of dispersion, amplitude modulation, and phase modulation.

Figure 25:
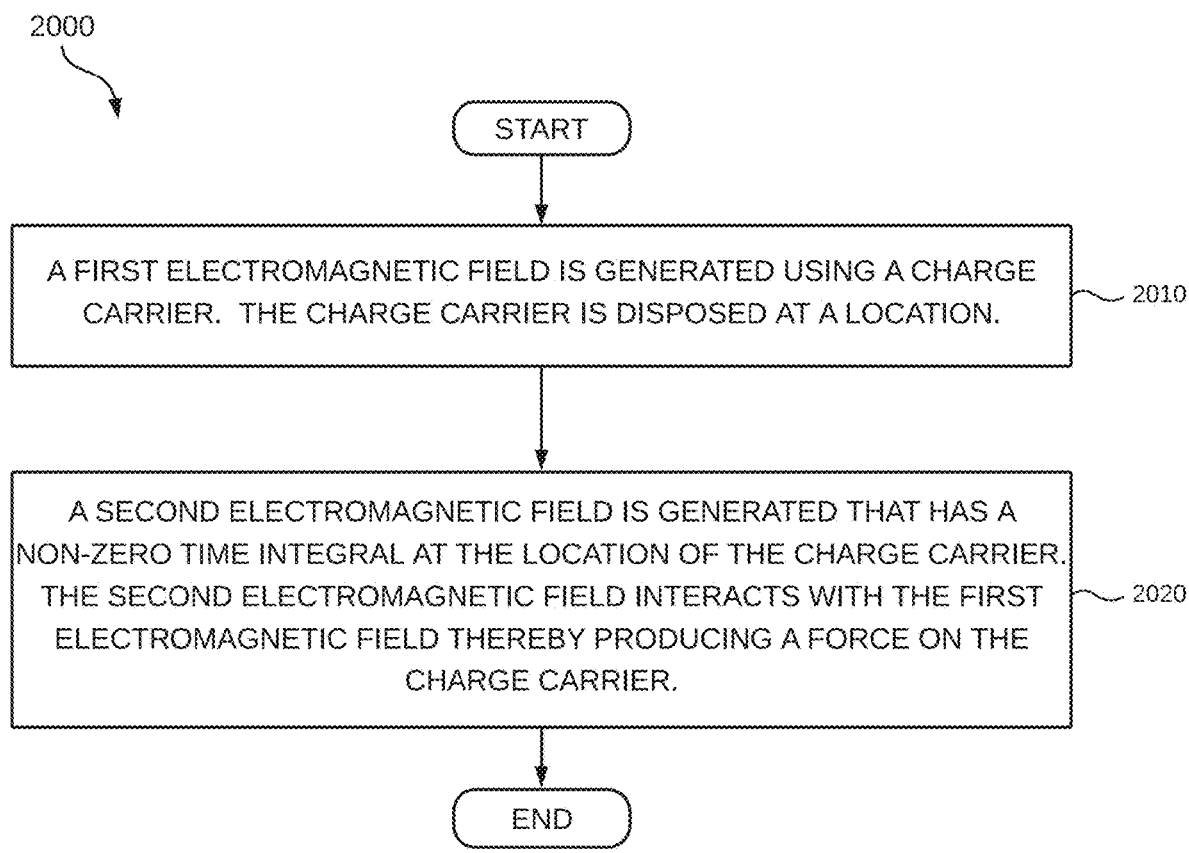
FIG. 25 is a flowchart of a method 2000 in accordance with another novel aspect.

FIG. 25 is a flowchart of a method 2000 in accordance with another novel aspect. In a first step (step 2010), a first electromagnetic field is generated using a charge carrier. The charge carrier is disposed at a location in space. The charge carrier comprises one or more charge carriers. For example, in FIG. 19, a charge carrier 1906 generates a first electromagnetic field.

In a second step (step 2020), a second electromagnetic field is generated that has a non-zero time integral at the location of the charge carrier. The second electromagnetic field interacts with the first electromagnetic field thereby producing a force on the charge carrier. For example, in FIG. 19, a radiation source comprises lasers 1900, 1908, 1912, and 1918. Each of lasers 1900, 1908, 1912, and 1918 is selectively controlled, singularly or in combination, to generate a second electromagnetic field having a non-zero time integral at the location of the charge carrier 1906. The second electromagnetic field interacts with the first electromagnetic field to produce a force on the charge carrier 1906.

Figure 26:
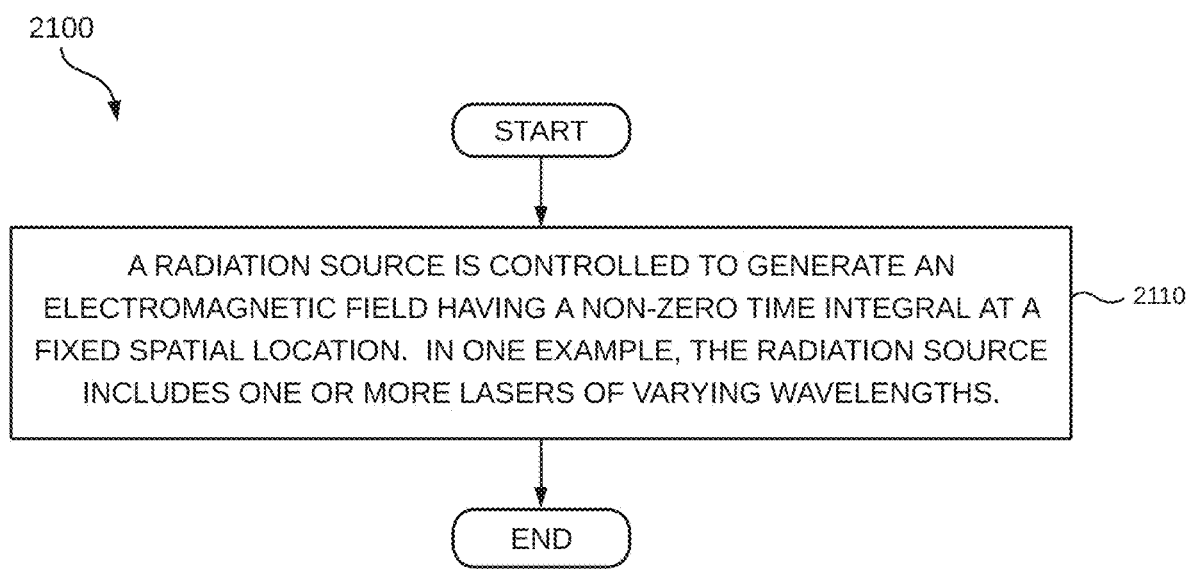
FIG. 26 is a flowchart of a method 2100 in accordance with another novel aspect.

FIG. 26 is a flowchart of a method 2100 in accordance with another novel aspect. In a first step (step 2110), a radiation source is controlled to generate an electromagnetic field having a non-zero time integral at a fixed spatial location. The radiation source includes one or more lasers of varying wavelengths. In the example of FIG. 19, lasers 1900, 1908, 1912, and 1918 operate as a radiation source to generate an electromagnetic field that has a non-zero time integral at fixed spatial location. In this embodiment, the fixed spatial location is selected to be the location of a charge carrier 1906.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A system comprising:
a charge carrier that generates a first electromagnetic field; and
a radiation source that generates a second electromagnetic field having a non-zero time integral at a location of the charge carrier, wherein the second electromagnetic field interacts with the first electromagnetic field thereby producing a force on the charge carrier, and wherein the radiation source is a laser or set of lasers.

2. The system of claim 1, wherein the laser or set of lasers is tuned.

3. The system of claim 1, wherein the laser or set of lasers is amplitude modulated.

4. The system of claim 1, wherein the laser or set of lasers is phase modulated.

5. A system comprising:
a radiation source configured to generate an electromagnetic field that has a non-zero time integral at a fixed spatial location, wherein the radiation source is a laser or set of lasers.

6. The system of claim 5, wherein the laser or set of lasers is tuned.

7. The system of claim 5, wherein the laser or set of lasers is amplitude modulated.

8. The system of claim 5, wherein the laser or set of lasers is phase modulated.

* * * * *